US012652063B2

(12) United States Patent
Blanksby

(10) Patent No.: US 12,652,063 B2
(45) Date of Patent: Jun. 9, 2026

(54) LOW-DENSITY PARITY CHECK (LDPC) DECODERS USING PARTIAL SYNDROME EARLY TERMINATION

(71) Applicant: Avago Technologies International Sales Pte. Limited, Singapore (SG)

(72) Inventor: Andrew Blanksby, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 21 days.

(21) Appl. No.: 18/785,976

(22) Filed: Jul. 26, 2024

(65) Prior Publication Data

US 2026/0031836 A1    Jan. 29, 2026

(51) Int. Cl.
*H03M 13/25* (2006.01)
(52) U.S. Cl.
CPC .................................. *H03M 13/255* (2013.01)
(58) Field of Classification Search
CPC .................................................... H03M 13/255
See application file for complete search history.

(56) References Cited

U.S. PATENT DOCUMENTS 8,028,216 B1 * 9/2011 Yeo .................... H03M 13/6362
714/755
2016/0087648 A1    3/2016 Korb et al.
2021/0184796 A1    6/2021 Ibrahim et al.

FOREIGN PATENT DOCUMENTS

CA        2977043 C  * 12/2019  ........ H03M 13/6362
CA        2975077 C  *  9/2020  ........ H03M 13/1102

OTHER PUBLICATIONS

Extended European Search Report on Appln. No. EP25191532.8 dated Nov. 26, 2025.

* cited by examiner

*Primary Examiner* — Joseph D Torres
(74) *Attorney, Agent, or Firm* — Foley & Lardner LLP

(57) ABSTRACT

An apparatus may include a receiver and one or more processors. The receiver may receive log likelihood ratio (LLR) values corresponding to encoded data that is encoded using a low-density parity-check (LDPC) code. The one or more processors may identify a number of punctured parity bits corresponding to the encoded data, determine that the number of punctured parity bits is less than a threshold, and remove, from a first parity check matrix corresponding to the encoded data, one or more rows corresponding to the number of punctured parity bits to generate a second parity check matrix. The one or more processors may determine, using the LLR values and the second parity check matrix, that there is an error in the LLR values, and an LDPC decoder may decode, based at least on the determination, the LLR values to resolve the error.

20 Claims, 16 Drawing Sheets

100

105

Baseband Circuitry 110

Encoder 130

115

Transmitter Circuitry 120

125

108

Baseband Circuitry 150

Decoder 160

145

Receiver Circuitry 140

400 d=-1 d=0 d=1 d=2 d=3 d=4 d=5 d=6

500

1000

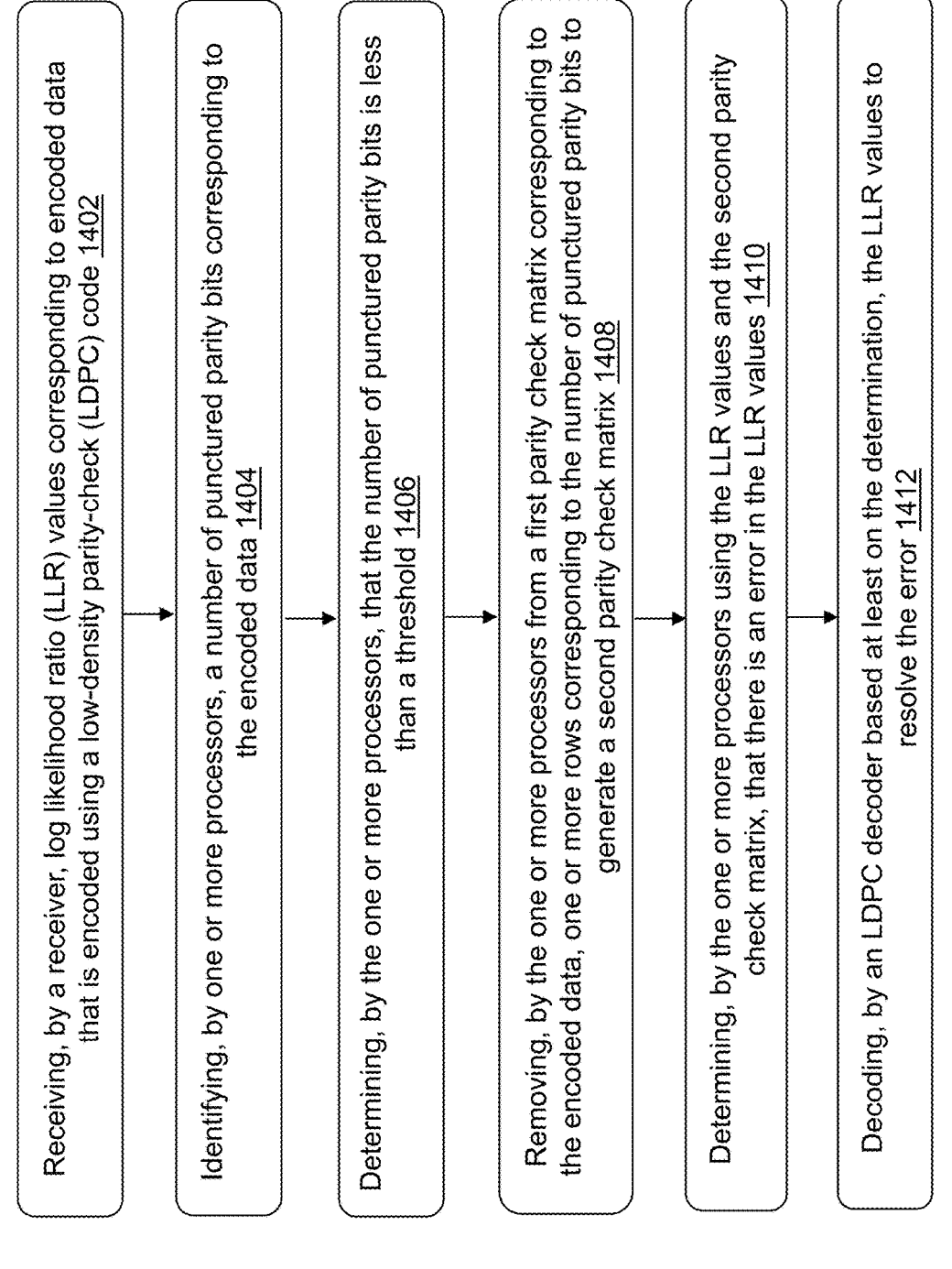

1400

Receiving, by a receiver, log likelihood ratio (LLR) values corresponding to encoded data that is encoded using a low-density parity-check (LDPC) code 1402

Identifying, by one or more processors, a number of punctured parity bits corresponding to the encoded data 1404

Determining, by the one or more processors, that the number of punctured parity bits is less than a threshold 1406

Removing, by the one or more processors from a first parity check matrix corresponding to the encoded data, one or more rows corresponding to the number of punctured parity bits to generate a second parity check matrix 1408

Determining, by the one or more processors using the LLR values and the second parity check matrix, that there is an error in the LLR values 1410

Decoding, by an LDPC decoder based at least on the determination, the LLR values to resolve the error 1412

FIG. 14

LOW-DENSITY PARITY CHECK (LDPC) DECODERS USING PARTIAL SYNDROME EARLY TERMINATION

FIELD OF THE DISCLOSURE

This disclosure generally relates to systems and methods for improving decoding process of a communications system, including but not limited to systems and methods for implementing low-density parity check (LDPC) decoders using partial syndromes and early termination schemes (referred to as "partial syndromes early termination" or "PSET").

BACKGROUND

Error correcting codes enable information data to be exchanged between a transmitter communication system and a receiver communication system in a reliable manner. A transmitter communication system encodes the information data to obtain a codeword. The codeword is encoded information data. The transmitter communication system transmits the codeword to the receiver communication system. Due to noise in the communication channel, the transmission received by the receiver communication system may not be identical to the transmitted codeword. Encoding information data allows a receiver communication system with a proper decoding process to recover the information data from the received transmission despite such noise. For example, the transmitter communication system transmits parity bits to the receiver communication system. The parity bits allow the receiver communication system to verify whether the received transmission is a valid codeword and to correct errors in the transmission if the received transmission is not a valid codeword. In one approach, when data received by the receiver communication system contains an error, the receiver communication system can correct the received data using parity bits. This correction or decoding process may consume a lot of power in the receiver communication system.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 14 is a flow diagram showing a process for decoding with a partial syndrome early termination scheme, in accordance with an embodiment.

Figure 1:
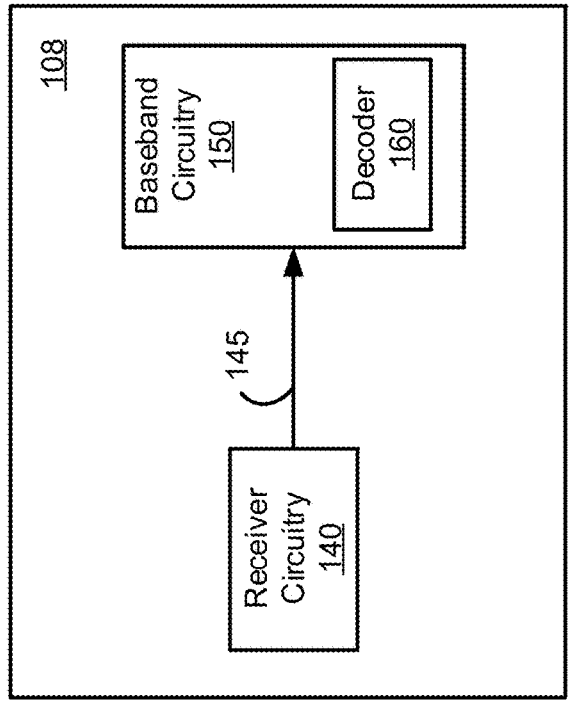
FIG. 1 is a diagram depicting an example communication environment with communication systems, according to one or more embodiments.
Figure 1:
Figure 1:
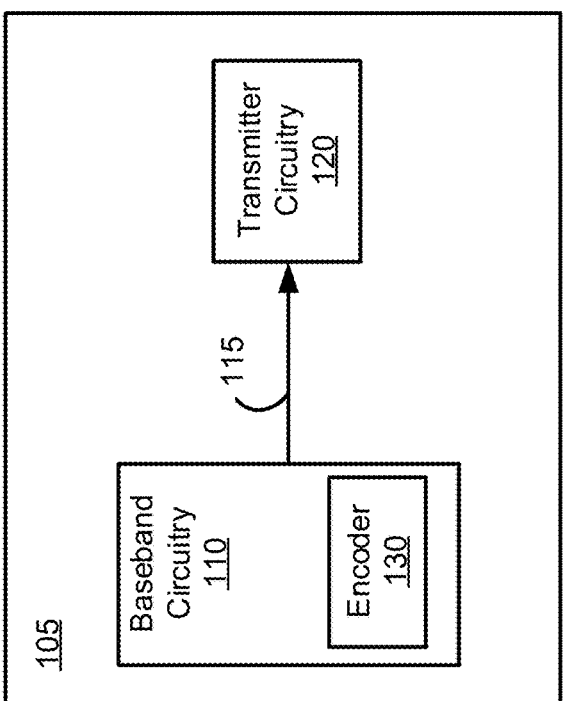

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, a first feature in communication with or communicatively coupled to a second feature in the description that follows may include embodiments in which the first feature is in direct communication with or directly coupled to the second feature and may also include embodiments in which additional features may intervene between the first and second features, such that the first feature is in indirect communication with or indirectly coupled to the second feature. In addition, the present disclosure may repeat reference numerals and/or letters in the various examples. This repetition is for the purpose of simplicity and clarity and does not in itself dictate a relationship between the various embodiments and/or configurations discussed.

Although various embodiments disclosed herein are described for encoding and/or decoding data for a wireless communication (e.g., wireless local area network (WLAN) conforming to any IEEE 802.11 standard including IEEE 802.11bn), principles disclosed herein are applicable to other types of communication (e.g., wired communication) or any process that performs encoding for error correction codes (e.g., low-density parity check (LDPC) codes, forward error correction (FEC) codes).

I. LDPC-Based Encoding/Decoding Systems

Generally, a parity check matrix for a code represents equations that determine whether errors have occurred during transmission. More formally, for all valid codewords (i.e., bits produced by the encoder with no errors), the following equation can be true:

$$Hc = 0 \qquad \text{(Equation 1)}$$

In Equation 1, "H" is the parity check matrix, "c" is a codeword vector, and "0" is a vector of all zeroes. The parity check matrix, H, is one way of describing a code.

A generator matrix for a code, G, satisfies the following equation:

$$sG = c \qquad \text{(Equation 2)}$$

In Equation 2, "s" is a vector of information bits (referred to as "systematic bits"), "G" is a generator matrix and "c" is the codeword that corresponds to "s." In some implementations, a system (e.g., a communication system 108 including a decoder 160 in FIG. 1) can decode the codeword c to obtain the decoded data s using Equation 2.

The parity check and generator matrices for a code are related per the above matrix equations. Generally, if a parity check matrix is low density, the corresponding generator matrix will be high density, and vice versa. LCPC codes are accordingly characterized by low density parity check matrices and high density generator matrices. The density of a matrix relates to the number of operations that must be performed to implement one of the above equations. Although it was recognized by 1995 that LDPC codes could be used to transmit data with very few errors, i.e., with error rates as good or better than turbo codes, one disadvantage of LDPC codes is that their generator matrices were high density and that made encoding computationally intensive, rending the codes impractical for many applications.

In some implementations, a parity check matrix may have a quasi-cyclic structure, for example, a parity check matrix for QC-LDPC code (n=3888, k=2916, R=¾). Given a lifting size z, the parity check matrix may have a plurality of sub-matrices such that each submatrix is cyclically shifted version of an identity matrix of size (z×z), where z=162, for example. A parity check matrix can be represented in two equivalent forms: (1) parity check matrix H and (2) a block matrix or an exponent matrix P=E(H).

In some implementations, a parity check matrix H may be a binary matrix whose size is m×n (each of m and n is an integer). Elements of the parity check matrix are binary values. Given a block length n and a code rate R, an LDPC code (or QC-LDPC code) LDPC (n, R) satisfies the following equations:

$$k = nR \qquad \text{(Equation 3)}$$

$$m = n(1 - R) \qquad \text{(Equation 4)}$$

In some implementations, a block matrix or an exponent matrix (QC-LDPC exponent matrix) may be obtained. Given a lifting size z, the exponent matrix P=E(H) may have a size of m/z×n/z. If n=24z (e.g., n=3888, z=162), then the size of P=E(H) is 24 (1-R)×24 (=n(1-R)/z×n/z). Elements of the exponent matrix may be integer values which correspond to cyclic shift values of identity matrix of size z×z. A parity check matrix H may be a sparse binary matrix that can be derived from an exponent matrix P=E(H). The generator matrix G may have a size n×k in binary form (e.g., elements of the generator matrix G are binary values). The exponent matrix P=E(H) may have a structure including a plurality of sub-matrices (e.g., A, B, C, D, E, T).

In some implementations, a binary QC-LDPC code LDPC (n, R) may be characterized by the null space of an n(1-R)×n parity check matrix H. The parity check matrix H may be a binary sparse matrix which includes a set of circulant matrices of size z×z. The parity-check matrix H of a QC-LDPC code can be represented equivalently by an exponent matrix P=E(H). This representation can help to illustrate the graphical structure of the underlying code as a base graph along with coefficient of shifting.

In some implementations, a parity check matrix H may be generated from an exponent matrix P=E(H). The exponent matrix P=E(H) may include (as elements) shift values d in the range $0<=d<z$ along with d=−1. For example, if z=7, the shift values d may include −1, 0, 1, 2, 3, 4, 5, 6. The shift value d=0 may correspond (or map) to an identity matrix of size z×z, denoted by I(z). The shift value d=−1 may correspond (or map) to a null matrix (all elements zero) of size z×z, denoted by 0*I(z). Any other integer value d in [1,z-1] may correspond (or map) to a matrix cyclically right shifted from I(z). The parity check matrix H can be obtained from the exponent matrix P=E(H) by expanding the exponent matrix P such that each element of the exponent matrix P (as a shift value d) is replaced by a matrix corresponding to the shift value.

In some implementations, the exponent matrix P=E(H) may include a plurality of elements P1,1, P1,2, P1,3, . . . , P1,ń; P2,1, P2,2, P2,3, . . . , P2,ń; . . . , P1,1, P1,2, P1,3, . . . , Pḿ,ń, which correspond to (ḿ×ń) values where ḿ and ń satisfy the following equations:

$$\acute{m} = n(1R)/z \qquad \text{(Equation 5)}$$

$$\acute{n} = n/z \qquad \text{(Equation 6)}$$

The exponent matrix (or permutation matrix) P=E(H) may be expressed as following:

$$P \equiv E(H) = \begin{pmatrix} P_{1,1} & P_{1,2} & P_{1,3} & \cdots & \cdots & P_{1,\acute{n}} \\ P_{2,1} & P_{2,2} & P_{2,3} & \cdots & \cdots & P_{2,\acute{n}} \\ \cdots & \ddots & \ddots & \cdots & \cdots & \vdots \\ P_{\acute{m},1} & P_{\acute{m},2} & P_{\acute{m},3} & \cdots & \cdots & P_{\acute{m},\acute{n}} \end{pmatrix} \qquad \text{(Equation 7)}$$

The corresponding parity check matrix H may be obtained by replacing each element of the matrix (as a shift value d) by a matrix C(d) corresponding to the shift value as follows:

$$H = \begin{pmatrix} C(P_{1,1}) & C(P_{1,2}) & C(P_{1,3}) & \cdots & \cdots & C\left(P_{1,\acute{n}}\right) \\ C(P_{2,1}) & C(P_{2,2}) & C(P_{2,3}) & \cdots & \cdots & C\left(P_{2,\acute{n}}\right) \\ \cdots & \ddots & \ddots & \cdots & \cdots & \vdots \\ C(P_{\acute{m},1}) & C(P_{\acute{m},2}) & C(P_{\acute{m},3}) & \cdots & \cdots & C\left(P_{\acute{m},\acute{n}}\right) \end{pmatrix} \qquad \text{(Equation 8)}$$

For example, a matrix C(1) may be expressed as follows:

$$C(1) = \begin{pmatrix} 0 & 1 & 0 & \cdots & \cdots & 0 \\ 0 & 0 & 1 & \cdots & \cdots & \ddots \\ \ddots & \ddots & \ddots & \cdots & \cdots & \vdots \\ 0 & 0 & 0 & \cdots & \cdots & 1 \\ 1 & 0 & 0 & \cdots & \cdots & 0 \end{pmatrix} \qquad \text{(Equation 9)}$$

In some implementations, an encoder can produce codewords using a generator matrix (e.g., using Equation 2). In some implementations, an encoder can use the parity check matrix (rather than the generator matrix) to produce code-words from vectors of information bits. After a parity check matrix H is obtained, the parity check matrix H may have sub-matrices A, B, C, D, T, E. An upper area O of the sub-matrix T may correspond to an area in which the matrix contains all zeroes, and the other areas may represent locations that can contain ones.

In some implementations, the codeword c can be obtained by the following expression:

$$c = [s \ p1 \ p2], \qquad \text{(Equation 10)}$$

where "s" is the vector of information bits to be encoded, "$p_1$" is a vector of the first g parity bits and "$p_2$" is a vector of the remaining m-g parity bits.

The vectors $p_1$ and $p_2$ can be obtained by the following equations:

$$\Phi = -ET^{-1}B + D; \qquad \text{(Equation 11)}$$

$$p_1^T = -\Phi^{-1}\left(-ET^{-1}A + C\right)s^T; \text{ and} \qquad \text{(Equation 12)}$$

$$p_2^T = -T^{-1}\left(As^T + Bp_1^T\right). \qquad \text{(Equation 13)}$$

Although various embodiments disclosed herein are described for encoding data for a wireless communication (e.g., wireless local area network (WLAN) conforming to any IEEE 802.11 standard), principles disclosed herein are applicable to other types of communication (e.g., wired communication) or any process that performs encoding for LDPC codes.

Figure 2:
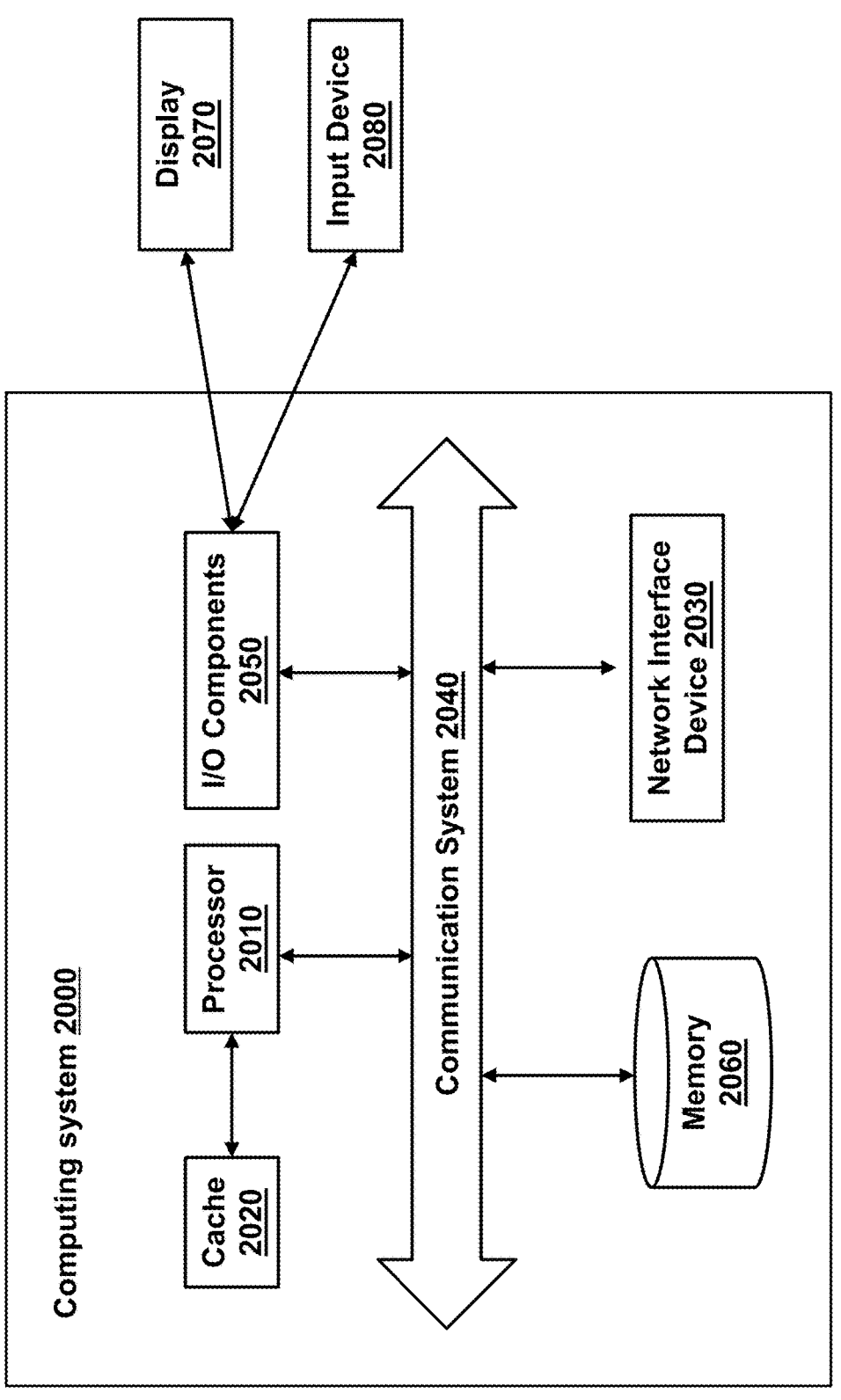
FIG. 2 is a schematic block diagram of a computing system, according to one or more embodiments.

Referring to FIG. 1, illustrated is a diagram depicting an example communication environment 100 including communication systems (or communication apparatuses) 105, 108, according to one or more embodiments. In one embodiment, the communication system 105 includes a baseband circuitry 110 and a transmitter circuitry 120, and the communication system 108 includes a baseband circuitry 150 and a receiver circuitry 140. In one aspect, the communication system 105 is considered a transmitter communication system, and the communication system 108 is considered a receiver communication system. These components operate together to exchange data (e.g., messages or frames) through a wireless medium. These components are embodied as application specific integrated circuit (ASIC), field programmable gate array (FPGA), or any combination of these, in one or more embodiments. In some implementations, the communication systems 105, 108 include more, fewer, or different components than shown in FIG. 1. For example, each of the communication systems 105, 108 includes transceiver circuitry to allow bi-directional communication between the communication systems 105, 108 or with other communication systems. In some implementations, each of the communication systems 105, 108 may have configuration similar to that of a computing system 2000 as shown in FIG. 2.

The baseband circuitry 110 of the communication system 105 is a circuitry that generates the baseband data 115 for transmission. The baseband data 115 includes information data (e.g., signal(s)) at a baseband frequency for transmission. In one approach, the baseband circuitry 110 includes an encoder 130 that encodes the data and generates or outputs parity bits. In one aspect, the baseband circuitry 110 (or encoder 130) obtains a generator matrix or a parity check matrix or uses a previously produced generator matrix or a previously produced parity check matrix and encodes the information data by applying the information data to the generator matrix or the parity check matrix to obtain a codeword. In some implementations, the baseband circuitry 110 stores one or more generator matrices or one or more parity check matrices that conform to any IEEE 802.11 standard for WLAN communication. The baseband circuitry 110 retrieves the stored generator matrix or the stored parity check matrix in response to detecting information data to be transmitted, or in response to receiving an instruction to encode the information data. In one approach, the baseband circuitry 110 generates the parity bits according to a portion of the generator matrix or using the parity check matrix and appends the parity bits to the information bits to form a codeword. The baseband circuitry 110 generates the baseband data 115 including the codeword for the communication system 108 and provides the baseband data 115 to the transmitter circuitry 120.

The transmitter circuitry 120 of the communication system 105 includes or corresponds to a circuitry that receives the baseband data 115 from the baseband circuitry 110 and transmits a wireless signal 125 according to the baseband data 115. In one configuration, the transmitter circuitry 120 is coupled between the baseband circuitry 110 and an antenna (not shown). In this configuration, the transmitter circuitry 120 up-converts the baseband data 115 from the baseband circuitry 110 onto a carrier signal to generate the wireless signal 125 at a radio frequency (RF) frequency (e.g., 10 MHz to 60 GHz), and transmits the wireless signal 125 through the antenna.

The receiver circuitry 140 of the communication system 108 is a circuitry that receives the wireless signal 125 from the communication system 105 and obtains baseband data 145 from the received wireless signal 125. In one configuration, the receiver circuitry 140 is coupled between the baseband circuitry 150 and an antenna (not shown). In this configuration, the receiver circuitry 140 receives the wireless signal 125 though an antenna, and down-converts the wireless signal 125 at an RF frequency according to a carrier signal to obtain the baseband data 145 from the wireless signal 125. The receiver circuitry 140 then provides the baseband data 145 to the baseband circuitry 150.

The baseband circuitry 150 of the communication system 108 includes or corresponds to a circuitry that receives the baseband data 145 from the receiver circuitry 140 and obtains information data from the received baseband data 145. In one embodiment, the baseband circuitry 150 includes a decoder 160 that extracts information and parity bits from the baseband data 145. The decoder 160 decodes the baseband data 145 to obtain the information data generated by the baseband circuitry 110 of the communication system 105.

In some implementations, each of the baseband circuitry 110 (including the encoder 130), the transmitter circuitry 120, the receiver circuitry 140, and the baseband circuitry 150 (including the decoder 160) may be as one or more processors, application specific integrated circuit (ASIC), field programmable gate array (FPGA), or any combination of them.

FIG. 2 is a schematic block diagram of a computing system, according to an embodiment. An illustrated example computing system 2000 includes one or more processors 2010 in direct or indirect communication, via a communication system 2040 (e.g., bus), with memory 2060, at least one network interface controller 2030 with network interface port for connection to a network (not shown), and other components, e.g., input/output ("I/O") components 2050. Generally, the processor(s) 2010 will execute instructions (or computer programs) received from memory. The processor(s) 2010 illustrated incorporate, or are connected to, cache memory 2020. In some instances, instructions are read from memory 2060 into cache memory 2020 and executed by the processor(s) 2010 from cache memory 2020. The computing system 2000 may not necessarily contain all of these components shown in FIG. 2 and may contain other components that are not shown in FIG. 2.

In more detail, the processor(s) 2010 may be any logic circuitry that processes instructions, e.g., instructions fetched from the memory 2060 or cache 2020. In many implementations, the processor(s) 2010 are microprocessor units or special purpose processors. The computing device 2050 may be based on any processor, or set of processors, capable of operating as described herein. The processor(s) 2010 may be single core or multi-core processor(s). The processor(s) 2010 may be multiple distinct processors.

The memory 2060 may be any device suitable for storing computer readable data. The memory 2060 may be a device with fixed storage or a device for reading removable storage media. Examples include all forms of volatile memory (e.g., RAM), non-volatile memory, media and memory devices, semiconductor memory devices (e.g., EPROM, EEPROM, SDRAM, and flash memory devices), magnetic disks, magneto optical disks, and optical discs (e.g., CD ROM, DVD-ROM, or Blu-Ray® discs). A computing system 2000 may have any number of memory devices 2060.

The cache memory 2020 is generally a form of computer memory placed in close proximity to the processor(s) 2010 for fast read times. In some implementations, the cache memory 2020 is part of, or on the same chip as, the processor(s) 2010. In some implementations, there are multiple levels of cache 2020, e.g., L2 and L3 cache layers.

The network interface controller 2030 manages data exchanges via the network interface (sometimes referred to as network interface ports). The network interface controller 2030 handles the physical and data link layers of the OSI model for network communication. In some implementations, some of the network interface controller's tasks are handled by one or more of the processor(s) 2010. In some implementations, the network interface controller 2030 is part of a processor 2010. In some implementations, the computing system 2000 has multiple network interfaces controlled by a single controller 2030. In some implementations, the computing system 2000 has multiple network interface controllers 2030. In some implementations, each network interface is a connection point for a physical network link (e.g., a cat-5 Ethernet link). In some implementations, the network interface controller 2030 supports wireless network connections and an interface port is a wireless (e.g., radio) receiver or transmitter (e.g., for any of the IEEE 802.11 protocols, near field communication "NFC", Bluetooth, ANT, or any other wireless protocol). In some implementations, the network interface controller 2030 implements one or more network protocols such as Ethernet. Generally, a computing device 2050 exchanges data with other computing devices via physical or wireless links through a network interface. The network interface may link directly to another device or to another device via an intermediary device, e.g., a network device such as a hub, a bridge, a switch, or a router, connecting the computing device 2000 to a data network such as the Internet.

The computing system 2000 may include, or provide interfaces for, one or more input or output ("I/O") devices. Input devices include, without limitation, keyboards, microphones, touch screens, foot pedals, sensors, MIDI devices, and pointing devices such as a mouse or trackball. Output devices include, without limitation, video displays, speakers, refreshable Braille terminal, lights, MIDI devices, and 2-D or 3-D printers.

Other components may include an I/O interface, external serial device ports, and any additional co-processors. For example, a computing system 2000 may include an interface (e.g., a universal serial bus (USB) interface) for connecting input devices, output devices, or additional memory devices (e.g., portable flash drive or external media drive). In some implementations, a computing device 2000 includes an additional device such as a co-processor, e.g., a math co-processor can assist the processor 2010 with high precision or complex calculations.

The components 2090 may be configured to connect with external media, a display 2070, an input device 2080 or any other components in the computing system 2000, or combinations thereof. The display 2070 may be a liquid crystal display (LCD), an organic light emitting diode (OLED) display, a flat panel display, a solid state display, a cathode ray tube (CRT) display, a projector, a printer or other now known or later developed display device for outputting determined information. The display 2070 may act as an interface for the user to see the functioning of the processor(s) 2010, or specifically as an interface with the software stored in the memory 2060.

The input device 2080 may be configured to allow a user to interact with any of the components of the computing system 2000. The input device 2080 may be a plurality pad, a keyboard, a cursor control device, such as a mouse, or a joystick. Also, the input device 2080 may be a remote control, touchscreen display (which may be a combination of the display 2070 and the input device 2080), or any other device operative to interact with the computing system 2000, such as any device operative to act as an interface between a user and the computing system 2000.

Figure 3:
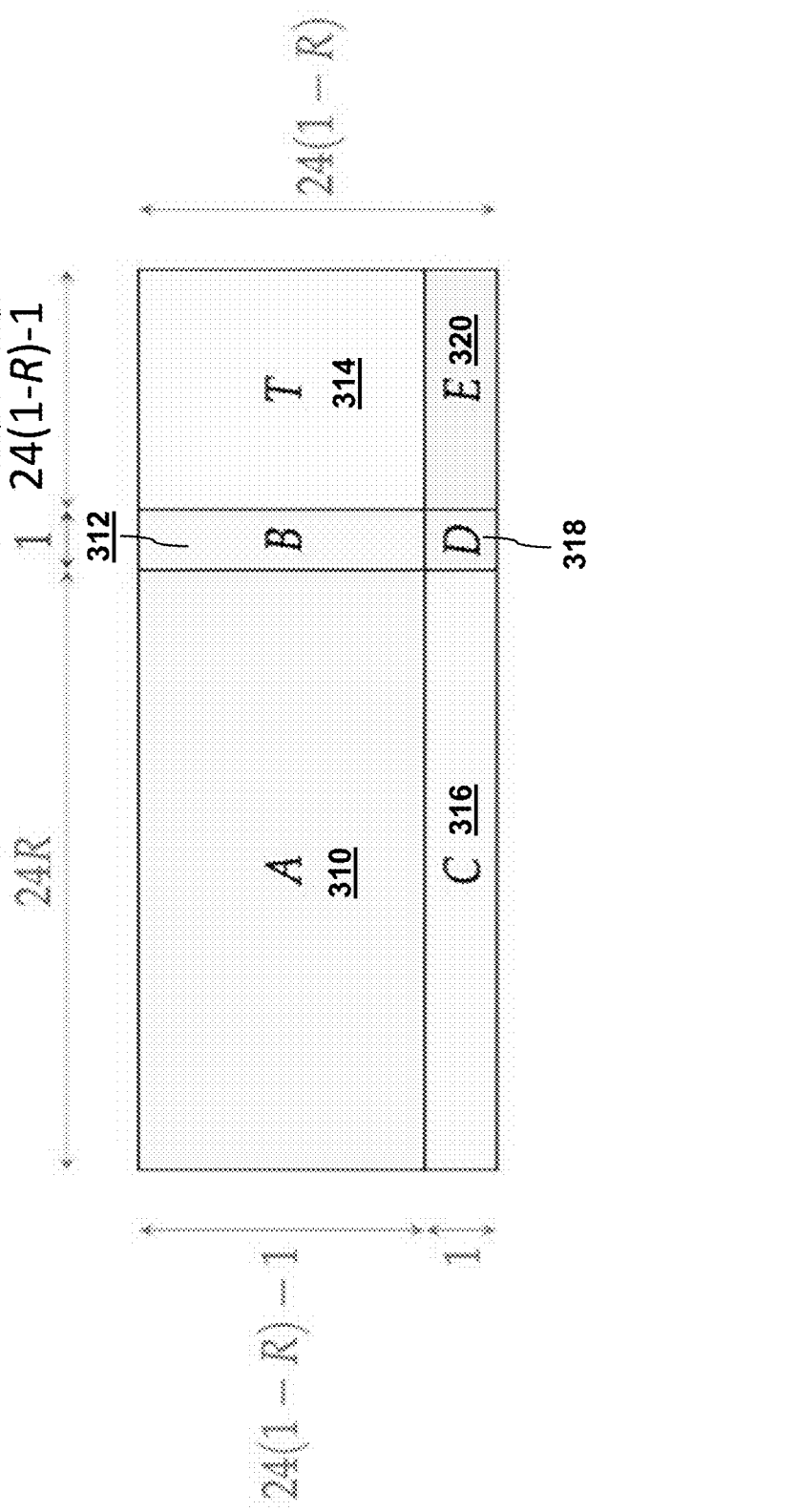
FIG. 3 is a diagram depicting an example exponent matrix, according to one or more embodiments.

FIG. 3 is a diagram depicting an example exponent matrix (QC-LDPC exponent matrix) 300, according to one or more embodiments. Given a lifting size z, the exponent matrix 300 may have a size of m/z×n/z. If n=24z (e.g., n=3888, z=162), then the size of P=E(H) is 24 (1-R)×24 (=n(1-R)/z×n/z). Elements of the exponent matrix may be integer values which correspond to cyclic shift values of identity matrix of size z×z. A parity check matrix H (see FIG. 5) may be a sparse binary matrix that can be derived from an exponent matrix P-E(H). The generator matrix G may have a size n×k in binary form (e.g., elements of the generator matrix G are binary values). Referring to FIG. 3, the exponent matrix P=E(H) may have a structure including a plurality of sub-matrices (e.g., A 310, B 312, C 316, D 318, E 320, T 314).

Figure 4:
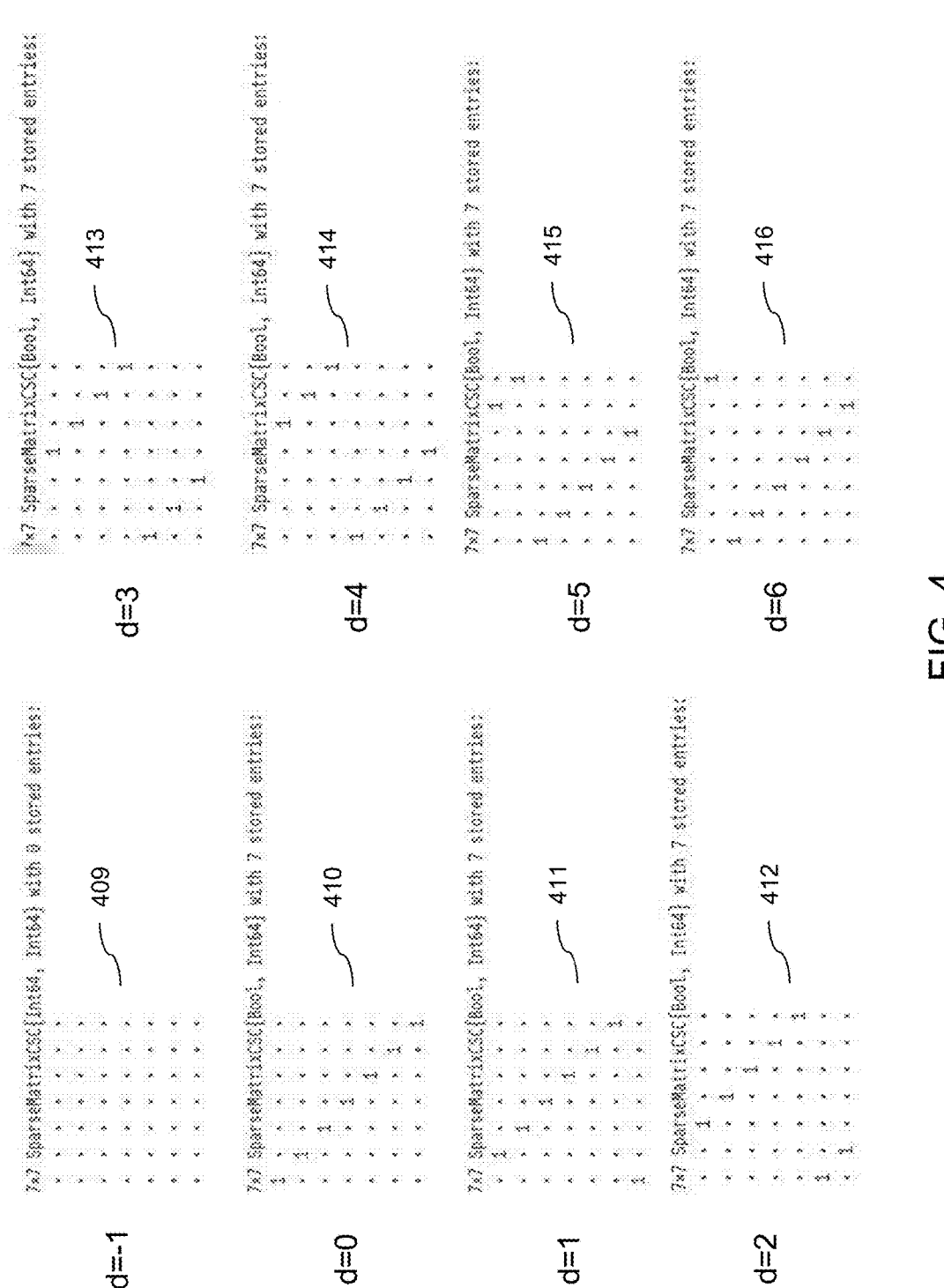
FIG. 4 is a diagram depicting example shifted identity matrices for generating a parity check matrix, according to one or more embodiments.

FIG. 4 is a diagram 400 depicting example shifted identity matrices 409, 410, 411, 412, 413, 414, 415, 416 for generating a parity check matrix, according to one or more embodiments. A parity check matrix H may be generated from an exponent matrix P=E(H) (e.g., exponent matrix 300) or may be identified using a codebook. As shown in Equation 7, the exponent matrix P=E(H) may include (as elements) shift values d in the range $0 <= d < z$ along with d=−1. See Equation For example, if z=7, the shift values d may include −1, 0, 1, 2, 3, 4, 5, 6 (see FIG. 4). The shift value d=0 may correspond (or map) to an identity matrix of size z×z, denoted by I(z) (e.g., matrix 410). The shift value d=−1 may correspond (or map) to a null matrix (all elements zero) of size z×z, denoted by 0*I(z) (e.g., matrix 409). Any other integer value d in [1,z-1] may correspond (or map) to a matrix cyclically right shifted from I(z) (e.g., matrices 411, 412, 413, 414, 415, 416). As shown in Equation 8, the parity check matrix H can be obtained from the exponent matrix P=E(H) by expanding the exponent matrix P such that each element of the exponent matrix P (as a shift value d) is replaced by a matrix corresponding to the shift value.

Figure 5:
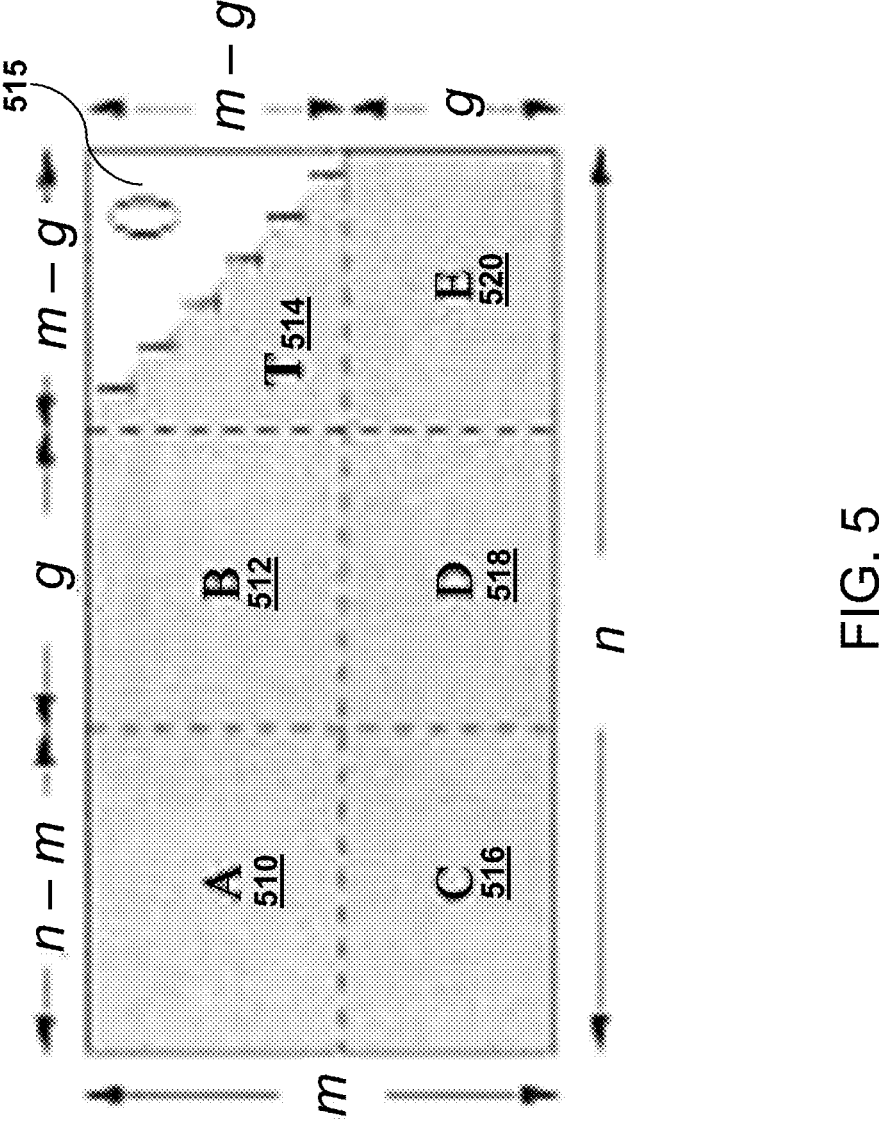
FIG. 5 is a diagram depicting an example parity check matrix, according to one or more embodiments.

FIG. 5 is a diagram depicting an example parity check matrix 500, according to one or more embodiments. In some implementations, an encoder (e.g., encoder 130) can produce codewords using a generator matrix (e.g., using Equation 2). In some implementations, an encoder (e.g., encoder 130) can use the parity check matrix (rather than the generator matrix) to produce codewords from vectors of information bits. After a parity check matrix H is obtained (e.g., using a codebook), the parity check matrix H (e.g., parity check matrix 500) may have sub-matrices A 510, B 512, C 516, D 518, T 514, E 520. An upper area O 515 of the sub-matrix T 514 (e.g., white area in FIG. 5) may correspond to an area in which the matrix contains all zeroes, and the other areas (e.g., grey area in FIG. 5) may represent locations that can contain ones. The size of the parity check matrix 500 may be m×n where the size of the sub-matrix D 518 is g×g, and the size of the sub-matrix T is (m-g)×(m-g). In some implementations, given a vector s of information bits to be encoded, the encoder can obtain a codeword c using Equation 10, Equation 11, Equation 12 and Equation 13.

Figure 6:
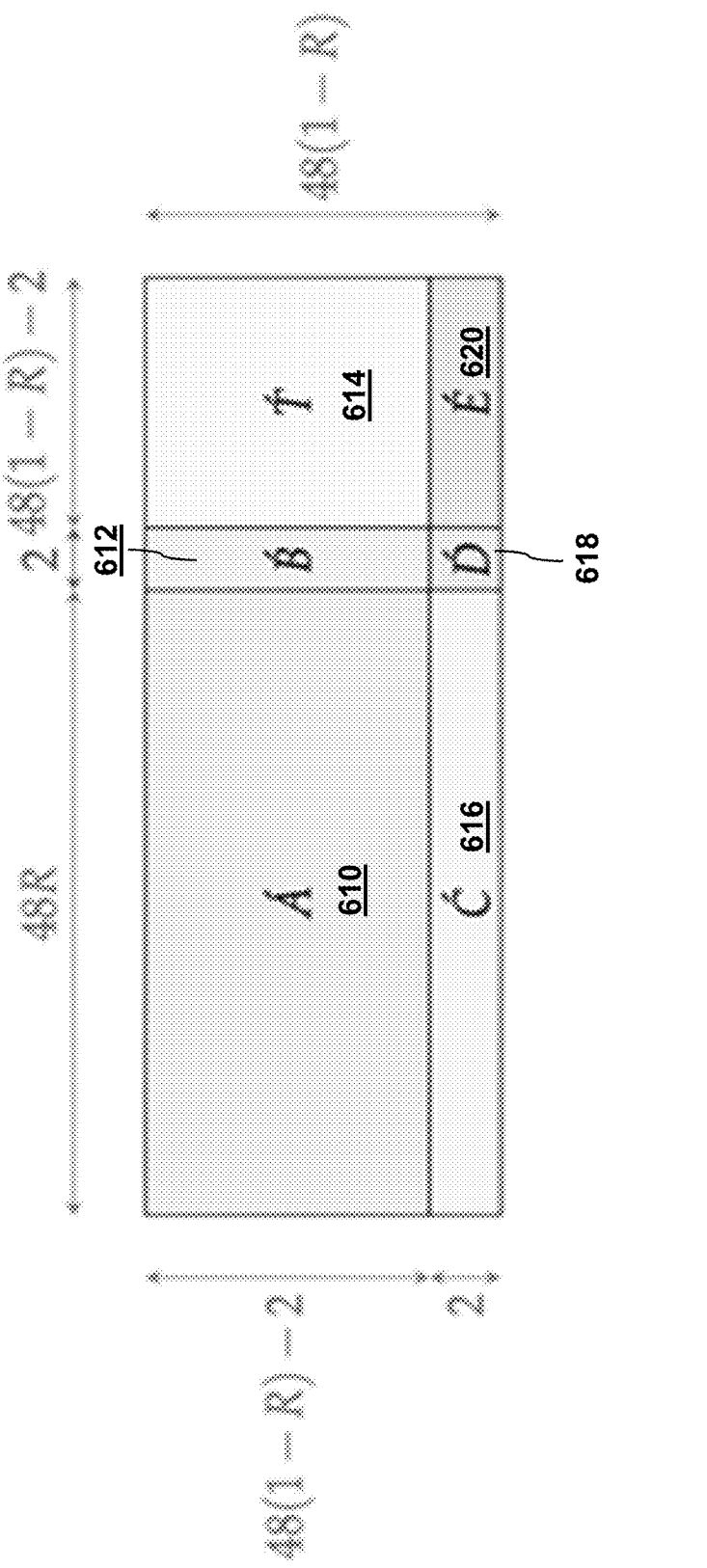
FIG. 6 is a diagram depicting an example exponent matrix, according to one or more embodiments.

FIG. 6 is a diagram depicting an example exponent matrix (QC-LDPC exponent matrix) 600, according to one or more embodiments. Given a lifting size z, the exponent matrix 600 may have a size of m/z×n/z. If n=48z (e.g., n=3888, z=81), then the size of Ṗ=E(H) matrix for n=3888 is 48 (1-R)×48 (=n(1-R)/z×n/z). Elements of the exponent matrix may be integer values which correspond to cyclic shift values of identity matrix of size z×z. A parity check matrix H may be a sparse binary matrix that can be derived from an exponent matrix Ṗ=E(H). The generator matrix G may have a size n×k in binary form (e.g., elements of the generator matrix G are binary values). Referring to FIG. 6, the exponent matrix Ṗ=E(H) may have a structure including a plurality of sub-matrices (e.g., Á 310, Ḃ 312, Ć 316, Ḋ 318, É 320, Ṫ 314).

II. LDPC Decoding Using Partial Syndrome Early Termination Schemes

In one aspect, a syndrome calculation before each iteration of LDPC decoding can be used as a termination condition to save power and latency. Here, a syndrome σ may refer to a value calculated as follows:

$$\sigma = H \times l_c \qquad \text{(Equation 14)}$$

In Equation 14, "H" is the parity check matrix, "$I_c$" is a binary LLR vector corresponding to a log-likelihood ratio (LLR) vector which corresponds to a received codeword vector c, and "σ" is a vector. An LLR value refers to a value indicating information about the likelihood of a (received) bit being 0 or 1 based on channel observations. For example, for a QAM (quadrature amplitude modulation), an LLR value corresponding to a received bit can be calculated based on a distance between a point corresponding to the received bit and a constellation point referring to bit value 1 and a distance between the point corresponding to the received bit and a constellation point referring to bit value 0. In calculating the syndrome σ, LLR values are not directly used. Instead the sign of each LLR value (referred to as "binary LLR value") can be used in the multiplication with H. It is noted that the inverse sign may be appropriate depending on how the LLRs are calculated. Hereinafter, an "LLR vector" or "LLR values" refer to a binary LLR vector or binary LLR values generated based on a sign of each LLR value.

As noted above, the parity check matrix, H, is one way of describing an LDPC code. When a receiver receives encoded data and obtains a binary LLR vector $I_c$ corresponding to the received data, the receiver (or a decoder thereof) may determine whether the syndrome σ is a vector of all zeroes. In response to determining that σ is a vector of all zeroes, the receiver may determine that the LLC vector $I_c$ does not contain any error because it satisfies Equation 1. On the other hand, in response to determining that σ is a non-zero vector, the receiver may determine that the binary LLR vector $I_c$ does contain an error because it does not satisfy Equation 1.

In other words, if the syndrome calculation (e.g., using Equation 14) is satisfied (e.g., the syndrome σ satisfies Equation 1), it means that the decoded bits are a valid codeword. However, in some communication systems, one or more of transmitted bits are (intentionally) punctured or deleted after encoding and prior to transmission to reduce the number of bits sent. Here, "punctured bits" or "punctured parity bits" refer to one or more parity bits discarded after encoding to increase the effective code rate and degrade a coding gain.

Typically, once a punctured transmission is received, it would not be possible to directly apply the syndrome calculation (e.g., Equation 14) until after the decoder has completed at least one iteration (or a partial iteration) because the punctured locations will likely cause the syndrome calculation to fail. For example, an LDPC decoder may handle punctured parity bits by initializing the corresponding LLR values to 0, and then performing decoding iterations as usual. The LDPC decoder may then attempt to correct the punctured locations the same way it does to correct actual error locations. This error correction typically takes 1-2 iterations even if the only error locations are the punctured locations. Even if the decoder corrected all the errors in the first iteration, because the syndrome calculation operates on the decoded bits produced by the previous decoder iteration, it might take until the end of the second iteration to perform the syndrome calculation (e.g., by a syndrome circuit) and (if the syndrome calculation is satisfied) stop the decoding process. The conventional LDPC decoders (e.g., decoders implemented in Wi-Fi chips) may run for a couple of iterations to "correct" the punctured parity bits, even if all the other received bits were correct. For an RX (receive) side, the power consumed to correct punctured parity bits may amount up to 10% of the digital RX power. It was also observed that most LDPC decoders perform a minimum of 2 iterations to correct punctured parity bits; and most WLAN packets have punctured parity bits for each codeword as defined by the physical layer protocol data unit (PPDU) encoding process in wireless standards (e.g., IEEE 802.11n/11ac/11ax/11be). Even at a high signal-to-noise ratio (SNR) with no received bit errors, the conventional decoder may perform a minimum of 1-2 iterations (per codeword) to correct punctured parity bits. It may take a further iteration period for serializing codewords for syndrome calculation. Hence, early termination without such iterations to correct punctured parity bits can save up to 40% of the digital RX power per codeword.

To address this problem, systems and methods according to some embodiments of the present disclosure can perform LDPC decoding by calculating a partial syndrome and terminating early based on the calculated partial syndrome (referred to as "partial syndrome early termination" or "PSET"). In some implementations, in a process of calculating a syndrome (referred to as "syndrome calculation"), a system (e.g., a communication system, receiver circuitry, or a decoder) can use specific knowledge of the location of one or more punctured parity bits in a codeword to disable (or remove contribution of) the equations corresponding to the punctured parity bits, such that the syndrome can in fact be computed correctly and used as a termination condition to prevent the decoder (e.g., LDPC decoder) from running and hence save power. In this manner, the system can reduce the average number of iterations for decoding. In some implementations, the system can calculate a PSET while the first iteration is running, thereby reducing the number of iterations.

In some implementations, in calculating a syndrome (or a partial syndrome), a system (e.g., a communication system, a receiver, a decoder, receiver circuitry or baseband circuitry; referred to as "partial syndrome early termination (PSET) system" or "PSET decoder") can use to disable, bypass, or avoid equations corresponding to punctured bits to correctly compute a syndrome and use the syndrome as a termination condition to prevent the LDPC decoder from running. In some implementations, the PSET system can take, as input, the sign of received LLR values corresponding to systematic bits and parity bits, and calculate a partial syndrome using a parity check matrix that has been used to encode the data corresponding to the received LLR values. The PSET system can determine whether the partial syndrome is zero or a zero vector. In response to determining that the partial syndrome is zero or a zero vector, assuming that there are no errors in the received LLR values, the PSET system does not run an LDPC decoder, or does stop/terminate a current iteration of LDPC decoding. This partial syndrome early termination (PSET) scheme can be effective at a sufficiently high SNR where there are likely no LLRs with incorrect sign.

In some implementations, a PSET system (e.g., a communication system, a receiver, receiver circuitry, baseband circuitry) may include one or more registers, a de-modulator, a decoder, and a MAC (medium access control) layer. For example, the PSET system can receive data over a channel with 20 MHz using a 1×1 single-input single-output (SISO) system (e.g., antenna), and decode the received data (or LLR values corresponding to the received data) using an LDPC code.

In some implementations, the one or more registers (e.g., PHY configuration registers) may store various configurations including at least one of physical layer (PHY) configuration, codeword configuration, or packet configuration. The PHY configuration may include a maximum iteration (e.g., a maximum number of iterations that the LDPC decoder can perform). The codeword configuration may include a number of codeword blocks, a size of codeword (e.g., number of codeword bits, an LDPC code length, or a codeblock size n), an LDPC code length (e.g., size of a parity check matrix), a code number, a number of systematic bits per block, a number of systematic bits blocks, a number of parity bits per block, a number of parity bits blocks.

In some implementations, the packet configuration may include parameters such as a dot11 mode, a PHY bandwidth (e.g., available bandwidth at PHY layer), a bandwidth (e.g., available bandwidth at MAC layer), a tone allocation, modulation and coding scheme (MCS) information, a number of spatial streams, a short guard interval, a space-time block coding (STBC), constellation information, a number of coded bits per symbol (CBPS), a number of CBPS short number of symbols, or packet extension information. These parameters can be used to calculate the maximum number of iterations possible for a given codeword. In some implementations, at least one of the codeword configuration or the packet configuration may be mathematically calculated based on PPDU (physical layer protocol data unit) information.

In some implementations, the de-modulator may de-modulate the received data to generate LLR streams for input to the decoder. For example, if the received data has been modulated using M-QAM, the de-modulator may perform an inverse operation of M-QAM.

In some implementations, the decoder may receive (1) various configurations including at least one of the PHY configuration, codeword configuration, or packet configuration (from the registers) and (2) LLR streams from the de-modulator, and generate decoded data (or decoded data streams) corresponding to the LLR streams. The decoder refers to any hardware (e.g., processor or circuitry), firmware, or software that can convert analog signals (as received at receiver circuitry) to digital signals. The decoder may include a PSET manager, an LDPC decoder, and/or a post-decoder. The decoder and each element thereof can be implemented using software, firmware, hardware (e.g., processor or circuitry), or a combination thereof.

In some implementations, the PSET manager may receive, as input, codeword configuration and perform, based on the codeword configuration, partial syndrome early termination (PSET). In some implementations, the PSET manager may perform PSET based on LLR information and matrix information. In some implementations, the PSET manager may calculate a partial syndrome using a sign of unscaled LLRs. In some implementations, the PSET manager may determine whether the calculated partial syndrome is zero or a zero vector. In response to determining that the calculated partial syndrome is zero or a zero vector, the PSET manager may generate a bypass signal to prevent or disable the LDPC decoder from running, or stop or terminate iterations for LDPC decoding (if the LDPC decoder was already running).

In some implementations, the LDPC decoder may perform an inverse operation of the LDPC encoder (e.g., an encoder included in a transmit-side communication system) that has encoded data to generate the data received by the PSET system. The LDPC decoder may refer to any hardware, firmware or software that can convert analog signals (e.g., as received at receiver circuitry) to digital signals using LDPC codes. In some implementations, in response to the PSET manager determining that the calculated partial syndrome is not zero or a zero vector, the LDPC decoder may receive, as input, (1) the LLR values and/or (2) a maximum number of iterations, decode the LLR values by iteration, and generate (1) the number of (actual) iterations performed by the LDPC decoder, (2) a value of a syndrome or a partial syndrome corresponding to the LLR values, and/or (3) decoded data or decoded bits corresponding to the LLR values. In some implementations, the LDPC decoder may include a layer-type decoder.

In some implementations, the post-decoder may receive, as input from the LDPC decoder, (1) the number of (actual) iterations, (2) a value of the syndrome or the partial syndrome, and/or (3) the decoded data or decoded bits. The post-decoder may generate, as output, decoding results for input to a medium access control (MAC) processor. The MAC processor refers to circuitry, processors, firmware or software that can process decoded data or a decoded frame at MAC layer.

The decoding results may include (1) decoded data, (2) valid decoded data, (3) the number of codewords, (4) the number of block errors, (5) a number of (actual) iterations, and/or (6) a decoded frame. In some implementations, the MAC processor may receive, as input from the post-decoder, the decoding results, and process the decoded data or the decoded frame at the MAC layer.

In some implementations, in calculating a syndrome (referred to as "partial syndrome"), the PSET system can remove or discard, from a parity check matrix, one or more rows corresponding to the punctured bits to generate a modified parity check matrix. For example, for an LDPC code with a codeword size of 648 and a code rate ½, if the number of punctured bits is 291, the PSET system can determine that only three equations can be valid and remove 321 (=324-3) rows from 324 rows of the parity check matrix to generate the modified parity check matrix. The PSET system can calculate the partial syndrome using the modified parity check matrix and received encoded data. The PSET system can determine, based on the calculator partial syndrome, whether the received encoded data contain an error or not. In response to determining that the received encoded data does not contain any error (e.g., the partial syndrome is equal to zero or a zero vector), the PSET system can prevent an LDPC decoder from running. In some implementations, in response to determining that the received encoded data does not contain any error, the PSET system can stop or terminate iterations for LDPC decoding (if the LDPC decoder was already running).

In some implementations, in response to determining that the received encoded data contains an error (e.g., the partial syndrome is not equal to zero or a zero vector), the PSET system can decode the received encoded data with the original parity check matrix. In some implementations, in response to determining that the received encoded data contains an error, the PSET system can handle punctured bits by initializing LLR values corresponding to the punctured bits, to 0, calculate a syndrome using the original parity check matrix, and then perform decoding iterations as usual (e.g., as if it does not use PSET). The PSET system can then attempt to correct the punctured locations in the same way as it attempts to correct actual error locations.

In some implementations, the PSET system can remove the contribution of parity check matrix rows corresponding to punctured parity bits (or locations of the punctured bits). In some implementations, the PSET system can logically calculate a parity for each row of a plurality of rows (in the parity check matrix) using one or more XOR gates and calculate a sum of the parities across the rows using one or more OR gates to determine a value of the final syndrome. In some implementations, the PSET system can remove, disable, skip, bypass or exclude rows corresponding to punctured parity bits or locations of the punctured parity bits, from the OR sum. For example, the PSET system can use a plurality of AND gates each of which takes a respective parity of a corresponding row and a respective enable/disable bit. By controlling the enable/disable bit for each row, the PSET system can remove, disable, skip, bypass or exclude the rows corresponding to punctured parity bits or locations of the punctured parity bits, from the OR sum.

In some implementations, the PSET system can remove, disable, skip, bypass or exclude rows corresponding to the punctured parity bits (or locations thereof), from parity calculation (e.g., using XOR gates), such that only the parities corresponding to valid rows can be added into the sum of parities across the valid rows (using OR gates).

Referring to FIGS. 7-10, embodiments of systems and methods for the present solution to implement a decoder using a partial syndromes early termination scheme are described and illustrated.

Figure 7:
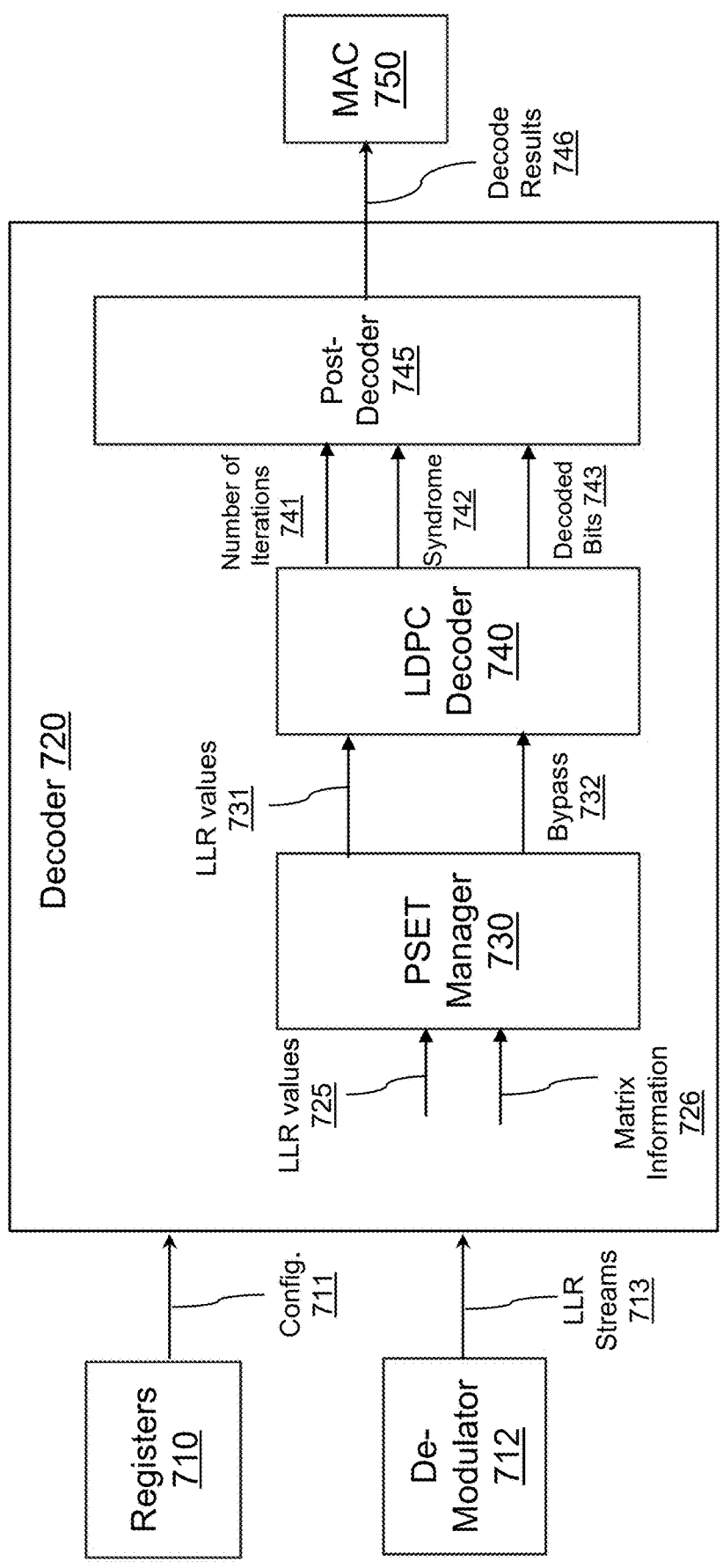
FIG. 7 is a diagram depicting an example PSET system according to one or more embodiments.

FIG. 7 is a diagram depicting an example PSET system 700 according to one or more embodiments. The PSET system (e.g., a communication system 108, a receiver or receiver circuitry 140, baseband circuitry 150) may include one or more registers 710, a de-modulator 712, a decoder 720, and/or a MAC layer 750. For example, the PSET system 700 can receive data over a channel with 20 MHz using a 1×1 SISO system (e.g., antenna), and decode the received data (or LLR values corresponding to the received data) using an LDPC code.

In some implementations, the one or more registers 710 (e.g., PHY configuration registers) may store various configurations including at least one of PHY configuration, codeword configuration, or packet configuration. The PHY configuration may include a maximum iteration (e.g., a maximum number of iterations that the LDCP decoder can perform). The codeword configuration may include a number of codeword blocks, a size of codeword (e.g., number of codeword bits, an LDPC code length, or a codeblock size n), an LDPC code length (e.g., size of a parity check matrix), a code number, a number of systematic bits per block, a number of systematic bits blocks, a number of parity bits per block, a number of parity bits blocks. In some implementations, the packet configuration may include a dot11 mode, a PHY bandwidth (e.g., available bandwidth at PHY layer), a bandwidth (e.g., available bandwidth at MAC layer), a tone allocation, MCS information, a number of spatial streams, a short guard interval, an STBC, constellation information, a number of CBPS, a number of CBPS short number of symbols, packet extension information. In some implementations, at least one of the codeword configuration or the packet configuration may be mathematically calculated based on PPDU information.

In some implementations, the de-modulator 712 may de-modulate the received data to generate LLR streams for input to the decoder. For example, if the received data has been modulated using M-QAM, the de-modulator may perform an inverse operation of M-QAM.

In some implementations, the decoder 720 may receive (1) various configurations 711 including at least one of the PHY configuration, codeword configuration, or packet configuration (from the registers 710) and (2) LLR streams 713 from the de-modulator 712, and generate decoded data (or decoded data streams) corresponding to the LLR streams. The decoder 720 may include a PSET manager 730, an LDPC decoder 740, and/or a post-decoder 745. The decoder 720 and each element thereof can be implemented using software, firmware, hardware (e.g., processor or circuitry), or a combination thereof.

In some implementations, the PSET manager 730 may receive, as input, codeword configuration and perform, based on the codeword configuration, partial syndrome early termination (PSET). The PSET manager 730 may perform PSET based on the LLRs 725 and the matrix information 726. The PSET manager 730 may calculate a partial syndrome using a sign of the LLRs 725. The PSET manager 730 may generate LLR values 731 for input to the LDPC decoder 740. The PSET manager 730 may determine whether the calculated partial syndrome is zero or a zero vector. In response to determining that the calculated partial syndrome is zero or a zero vector, the PSET manager 730 may generate a bypass signal 732 to prevent or disable the LDPC decoder 740 from running, or stop or terminate iterations for LDPC decoding (if the LDPC decoder 740 was already running).

In some implementations, the LDPC decoder 740 may perform an inverse operation of the LDPC encoder (e.g., an encoder included in a transmit-side communication system) that has encoded data to generate the data received by the PSET system 700. In response to the PSET manager 730 determining that the calculated partial syndrome is not zero or a zero vector, the LDPC decoder 740 may receive, as input, (1) the LLR values 731 and/or (2) a maximum number of iterations, decode the LLR values 731 by iteration, and generate (1) the number of (actual) iterations 741 performed by the LDPC decoder, (2) a value of a syndrome or a partial syndrome 742 corresponding to the LLR values, and/or (3) decoded data or decoded bits 743 corresponding to the LLR values. The LDPC decoder 740 may include a layer-type decoder.

In some implementations, the post-decoder 745 may receive, as input from the LDPC decoder 740, (1) the number of (actual) iterations 741, (2) a value of the syndrome or the partial syndrome 742, and/or (3) the decoded data or decoded bits 743. The post-decoder 745 may generate, as output, decoding results 746 for input to a MAC processor 750. The decoding results 746 may include (1) decoded data, (2) valid decoded data, (3) the number of codewords, (4) the number of block errors, (5) a number of (actual) iterations, and/or (6) a decoded frame. The MAC processor 750 may receive, as input from the post-decoder 745, the decoding results 746, and process the decoded data or the decoded frame at the MAC layer.

Figure 8A:
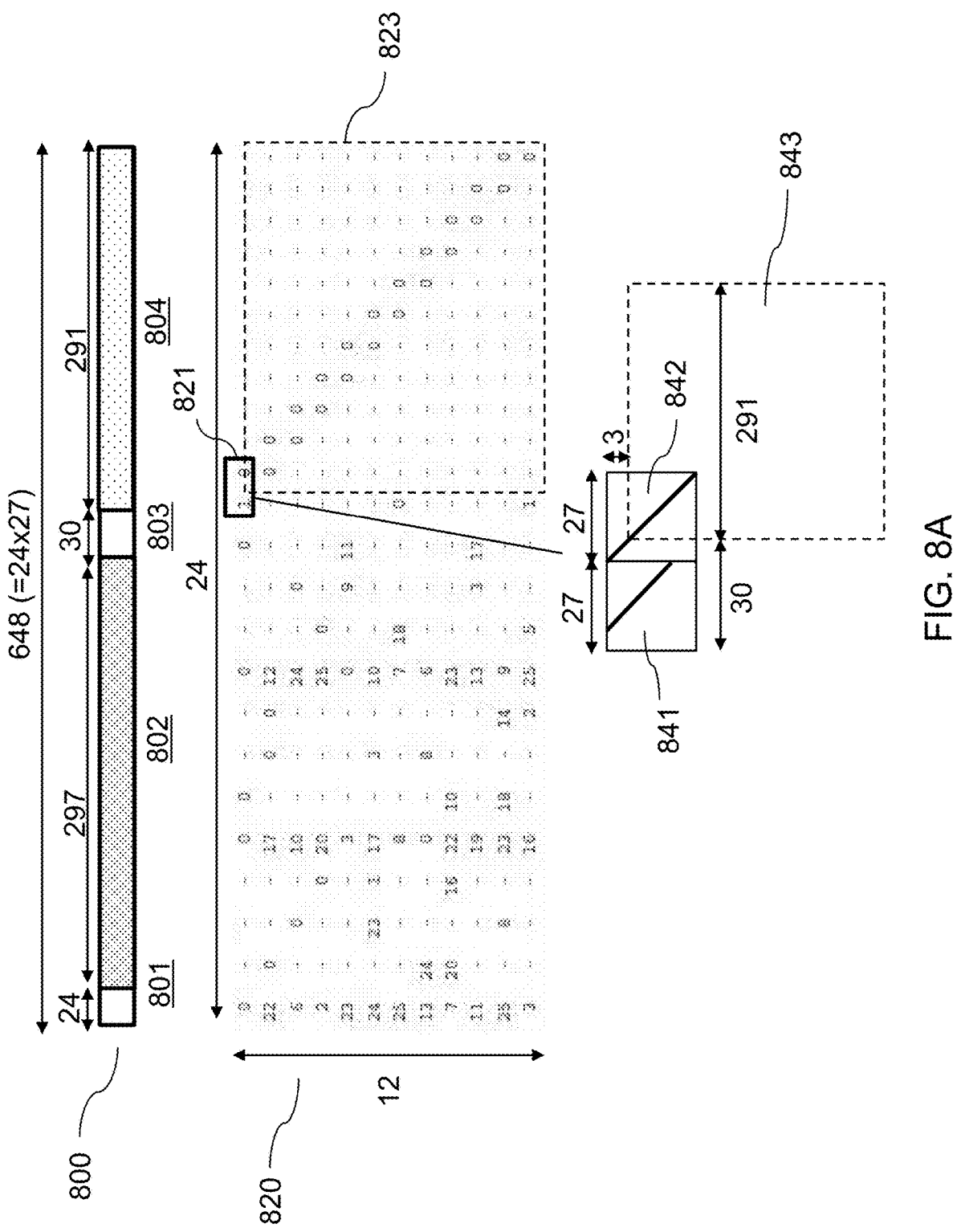
FIG. 8A to FIG. 8B are diagrams depicting an example of a codeword and an LDPC code, according to one or more embodiments.
Figure 8B:
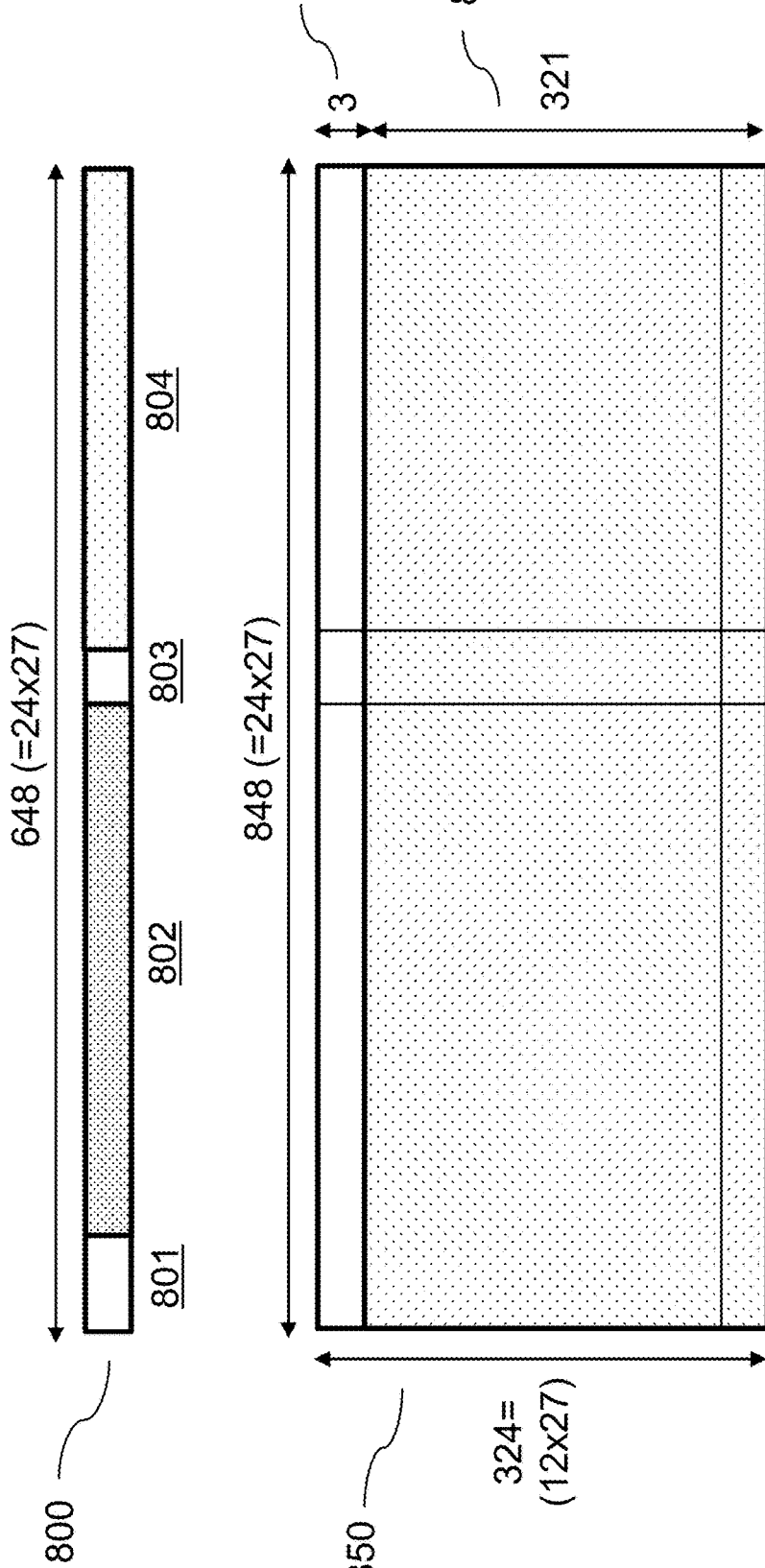

FIG. 8A to FIG. 8B are diagrams depicting an example of a codeword and an LDPC code, according to one or more embodiments. FIG. 8A shows an example codeword 800 (648 bit) including a set of systematic bits and a set of parity bits. The set of systematic bits may include valid systematic bits 801 (24 bits) and shortened bits 802 (297 bits). Here, the "shortened bits" refer to zero bits that are padded to data bits before encoding and discarded after encoding, to reduce the effective code rate and improve a coding gain. The set of parity bits may include valid parity bits 803 (30 bits; as actually received by the receiver-side communication system) and punctured bits 804 (291 bits). FIG. 8A also shows an exponent matrix H 820 (12×24 matrix) corresponding to the codeword 800. The exponent matrix 820 may contain a portion 823 corresponding to the punctured bits 291. The exponent matrix 820 may contain a portion 821 including a boundary of the portion 823. The portion 821 may include "1" and "0" which correspond to a portion 841 and a portion 842, respectively, in the corresponding parity check matrix H 850 (see FIG. 8B). The parity check matrix 850 may include a portion 843 (referred to as "punctured portion") corresponding to the portion 823. As shown in the portion 842, only uppermost 3 rows of the parity check matrix 850 (and equations corresponding to those rows) are not affected by the punctured portion 843, while the remaining rows (e.g., 321 rows out of 324 rows) being affected by the punctured portion 843. In other words, as shown in FIG. 8B, the parity check matrix 850 may include a set of rows 851 corresponding to valid equations (e.g., equations that are not affected by the punctured parity bits) and a set of rows 852 corresponding to invalid equations (e.g., equations that are affected by the punctured parity bits).

Figure 9:
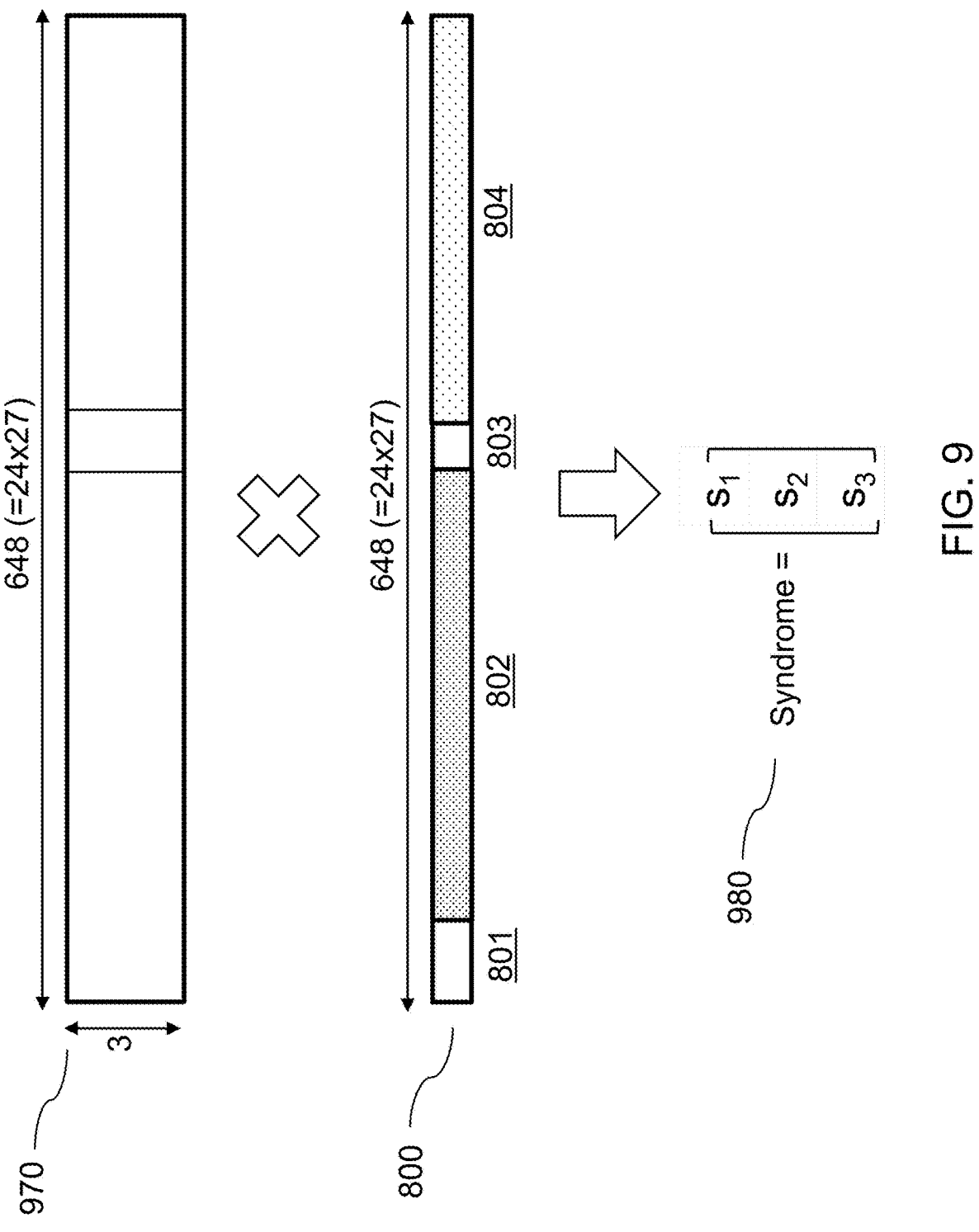
FIG. 9 is a diagram depicting another example of calculating a partial syndrome for an LDPC code, according to one or more embodiments.

FIG. 9 is a diagram depicting another example of calculating a partial syndrome for an LDPC code, according to one or more embodiments. Referring to FIG. 9, in calculating a syndrome (or "partial syndrome") 980, a PSET system (e.g., PSET system 700) can remove or discard, from the parity check matrix (e.g., parity check matrix 850 in FIG. 8B), one or more rows corresponding to the punctured bits (e.g., the set of rows 852 in FIG. 8B) to generate a modified parity check matrix 970. For example, for an LDPC code with a codeword size of 648 and a code rate ½, if the number of punctured bits is 291 (e.g., the portion 804), the PSET system can determine that only three equations can be valid and remove 321 (=324-3) rows from 324 rows of the parity check matrix 850 to generate the modified parity check matrix 970. The PSET system can calculate the partial syndrome 980 using the modified parity check matrix 970 and received encoded data (e.g., the codeword 800). For example, the PSET system can calculate the syndrome 980 by multiplying the modified parity check matrix 970 by the codeword 800.

In some implementations, the PSET system can determine, based on the calculator partial syndrome (e.g., partial syndrome 980), whether the received encoded data contain an error or not. In response to determining that the received encoded data does not contain any error (e.g., the partial syndrome 980 is equal to zero or a zero vector), the PSET system can prevent an LDPC decoder (e.g., LDPC decoder 740) from running. In response to determining that the received encoded data does not contain any error, the PSET system can stop or terminate iterations for LDPC decoding (if the LDPC decoder was already running).

In some implementations, in response to determining that the received encoded data contains an error (e.g., the partial syndrome 980 is not equal to zero or a zero vector), the PSET system can decode the received encoded data with the original parity check matrix (e.g., parity check matrix 850). In response to determining that the received encoded data contains an error, the PSET system can handle punctured bits by initializing LLR values corresponding to the punctured bits (e.g., portion 804), to 0, calculate a syndrome using the original parity check matrix 850, and then perform decoding iterations as usual (e.g., as if it does not use PSET). The PSET system can then attempt to correct the punctured locations in the same way as it attempts to correct actual error locations.

Figure 10A:
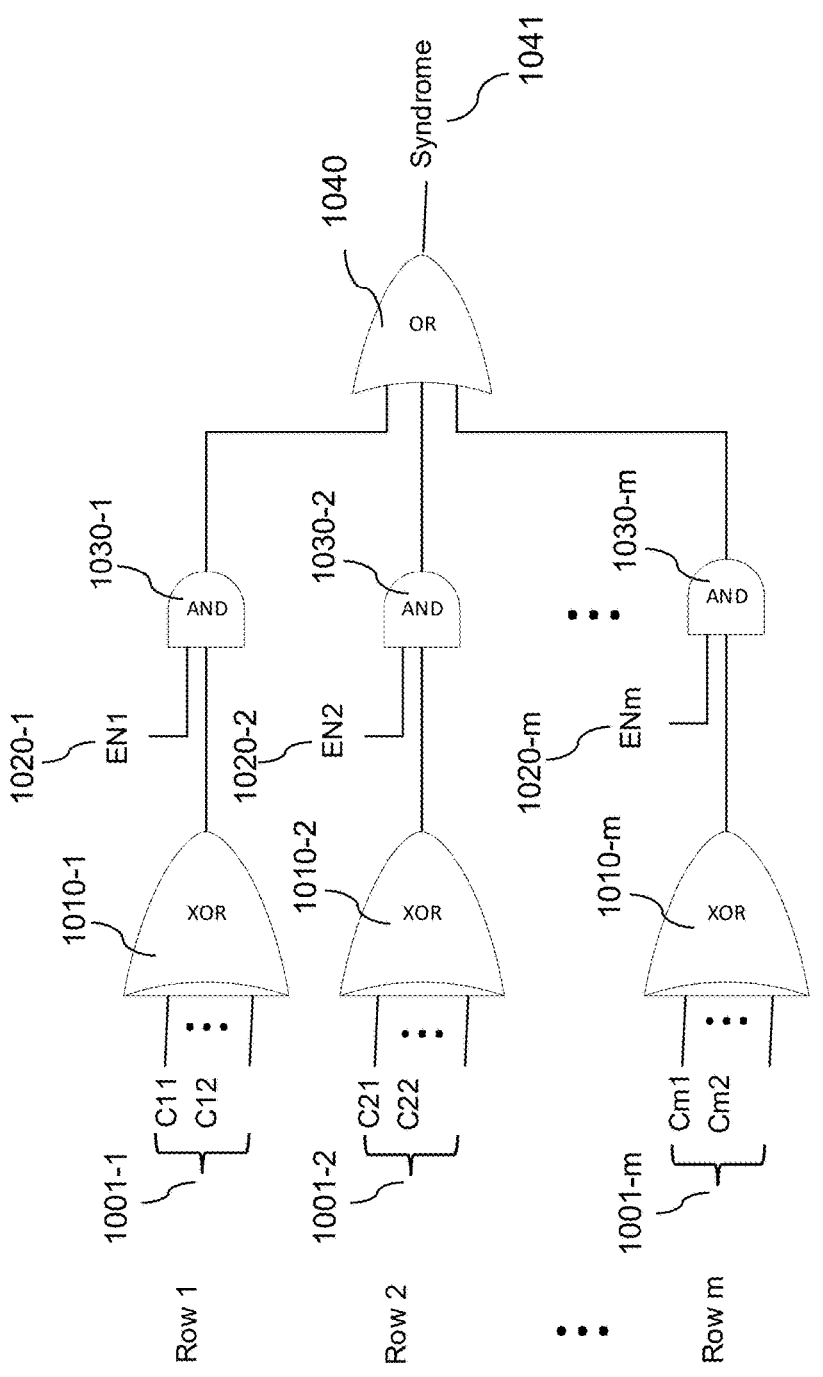
FIG. 10A and FIG. 10B are diagrams depicting another example of calculating a partial syndrome for an LDPC code, according to 8 one or more embodiments.
Figure 10B:
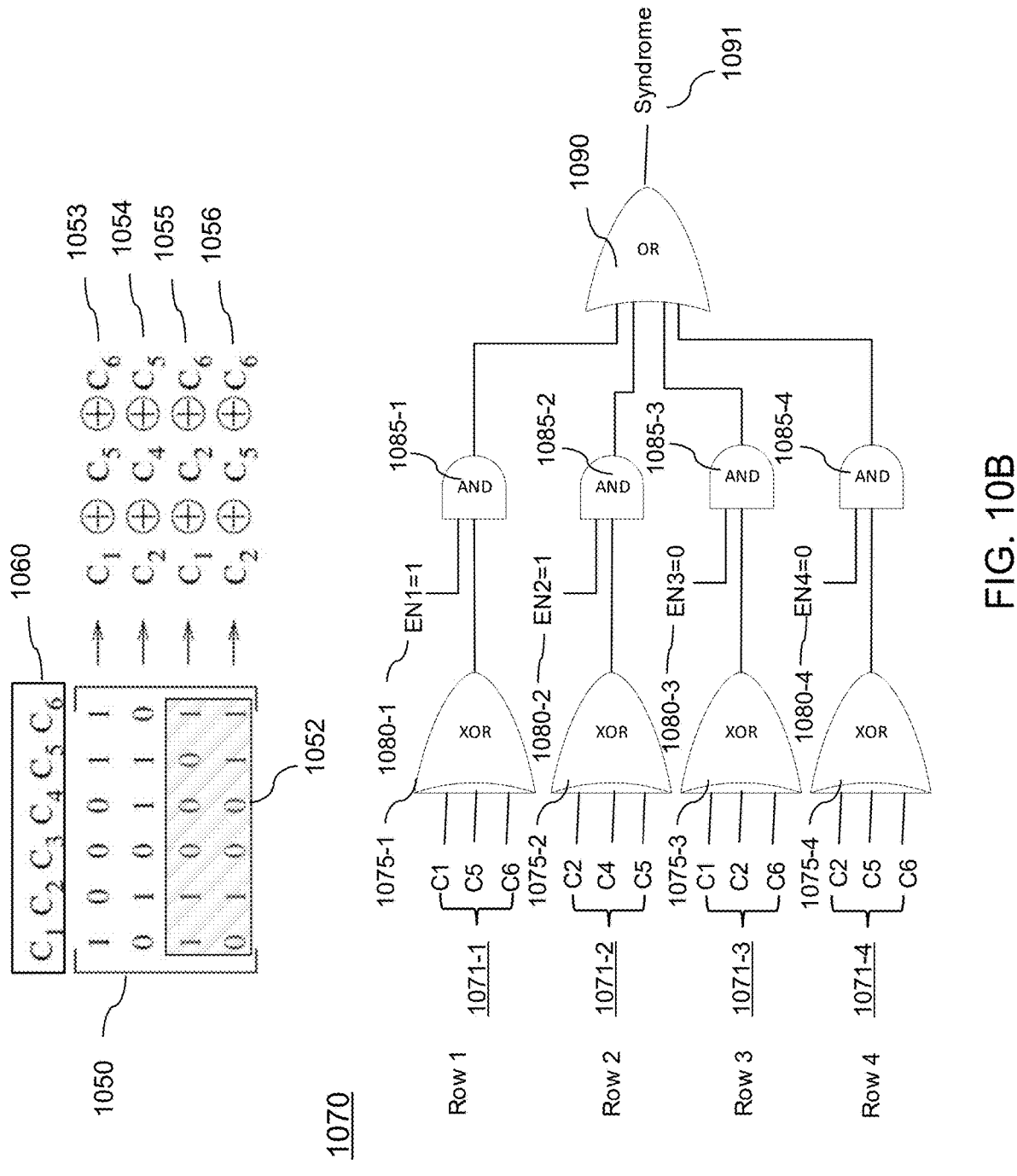

FIG. 10A and FIG. 10B are diagrams depicting another example of calculating a partial syndrome for a LDPC code, according to one or more embodiments. A PSET system (e.g., PSET system 700) can remove the contribution of parity check matrix rows (e.g., the portion 852 in FIG. 8B) corresponding to punctured parity bits (or locations of the punctured parity bits). FIG. 10A shows a logical structure 1000 for calculating a parity for each row of a plurality of rows (e.g., rows 1, 2, . . . , m) in the parity check matrix using one or more XOR gates (e.g., XOR gates 1010-1, 1010-2, . . . , 1010-m), and calculate a sum of the parities across the rows using one or more OR gates (e.g., OR gate 1040) to determine a value of the final syndrome 1041. For example, the parity of each row (e.g., row 1, 2, . . . , m) can be calculated by multiplying each element of that row and a corresponding element of a codeword to calculate a respective multiplication result and performing an XOR operation on the respective multiplication results (e.g., sets of multiplication results 1001-1, 1001-2, . . . , 1001-m). The PSET system can remove, disable, skip, bypass or exclude rows corresponding to punctured parity bits or locations of the punctured parity bits, from the OR sum. For example, referring to FIG. 10A, the PSET system can use a plurality of AND gates (e.g., AND gates 1030-1, 1030-2, . . . , 1030-m) each of which takes a respective parity of a corresponding row and a respective enable/disable bit (e.g., EN bits 1020-1, 1020-2, . . . , 1020-$m$). By controlling the enable/disable bit for each row (e.g., EN bits 1020-1, 1020-2, . . . , 1020-$m$), the PSET system can remove, disable, skip, bypass or exclude the rows corresponding to punctured parity bits (e.g., set of rows 852 in FIG. 8B) or locations of the punctured parity bits, from the OR sum (e.g., output of the OR gate 1040). In this manner, the PSET system can remove, disable, skip, bypass or exclude rows corresponding to the punctured parity bits (or locations thereof), from parity calculation (e.g., using XOR gates 1010-1, 1010-2, . . . , 1010-$m$), such that only the parities corresponding to valid rows can be added into the sum of parities across the valid rows (using OR gates 1040). The logical structure 1000 can be implemented in hardware (e.g., circuit or processor), firmware, software, or a combination thereof.

FIG. 10B shows a diagram showing an example calculation of a partial syndrome using the structure 1000 shown in FIG. 10A. FIG. 10B shows an example parity check matrix 1051 which includes a punctured portion 1052 including rows 3, 4 corresponding to the punctured parity bits. The PSET system may calculate a parity of each row (e.g., parities 1053, 1054, 1055, 1056) by (1) multiplying each element of that row and a corresponding element of a codeword 1060 to calculate a respective multiplication result (e.g., $C_1$, $C_5$, $C_6$ in row 1), and performing an XOR operation on the respective multiplication results (e.g., $C_1 \oplus C_5 \oplus C_6$ in row 1). In some implementations, the PSET system may calculate a parity of each row by (1) selecting one or more rows that do not correspond to punctured parity bits, (2) calculating, for each row of the selected one or more rows, an exclusive OR (XOR) of one or more bits of the codeword 1060 that correspond to non-zero elements of each row (e.g., the bits $C_1$ $C_5$ $C_6$ of the codeword 1060 that correspond to non-zero element of row 1) to generate an XOR value of each row (e.g., $C_1 \oplus C_5 \oplus C_6$ in row 1). The PSET system may be configured to calculate, as the first value (e.g., partial syndrome 1091), an OR of the XOR values of the selected one or more rows (e.g., OR sum 1090 of parities of rows 1 and 2).

FIG. 10B also shows a logical structure 1070 for calculating a parity for each row of a plurality of rows 1, 2, 3, 4 in the parity check matrix 1050 using XOR gates 1075-1, 1075-2, 1075-3, 1075-4 and calculate a sum of the parities across the rows 1, 2, 3, 4 using an OR gate 1090 to determine a value of the final syndrome 1091. For example, the parity of each row 1, 2, 3, 4 can be calculated by multiplying each element of that row and a corresponding element of a codeword to calculate a respective multiplication result, and performing an XOR operation on the respective multiplication results to generate the parity of that row 1071-1, 1071-2, 1071-3, 1071-4. A PSET system (e.g., PSET system 700) can remove, disable, skip, bypass or exclude rows corresponding to punctured parity bits or locations of the punctured parity bits (e.g., rows 3, 4 of the parity check matrix 1050), from the OR sum. Referring to FIG. 10B, the PSET system can use AND gates 1085-1, 1085-2, 1085-3, 1085-4 each of which takes a respective parity of a corresponding row and a respective enable/disable bit EN1 1080-1, EN2 1080-2, EN3 1080-3, EN4 1080-4. The PSET system can set EN3 and EN4 (which correspond to the punctured parity bits) to 0, so that the rows 3, 4 can be excluded from the OR sum.

Figure 11B:
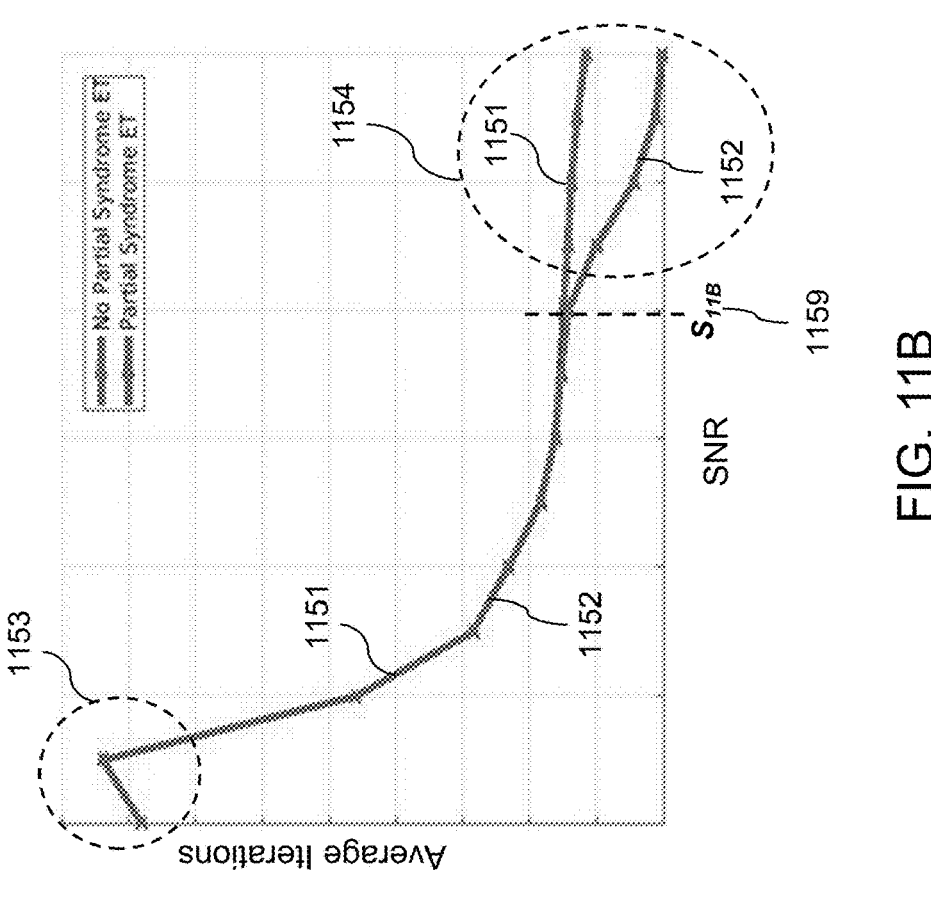
FIG. 11A and FIG. 11B are diagrams depicting simulation results of a partial syndrome early termination scheme, according to one or more embodiments.
Figure 11A:
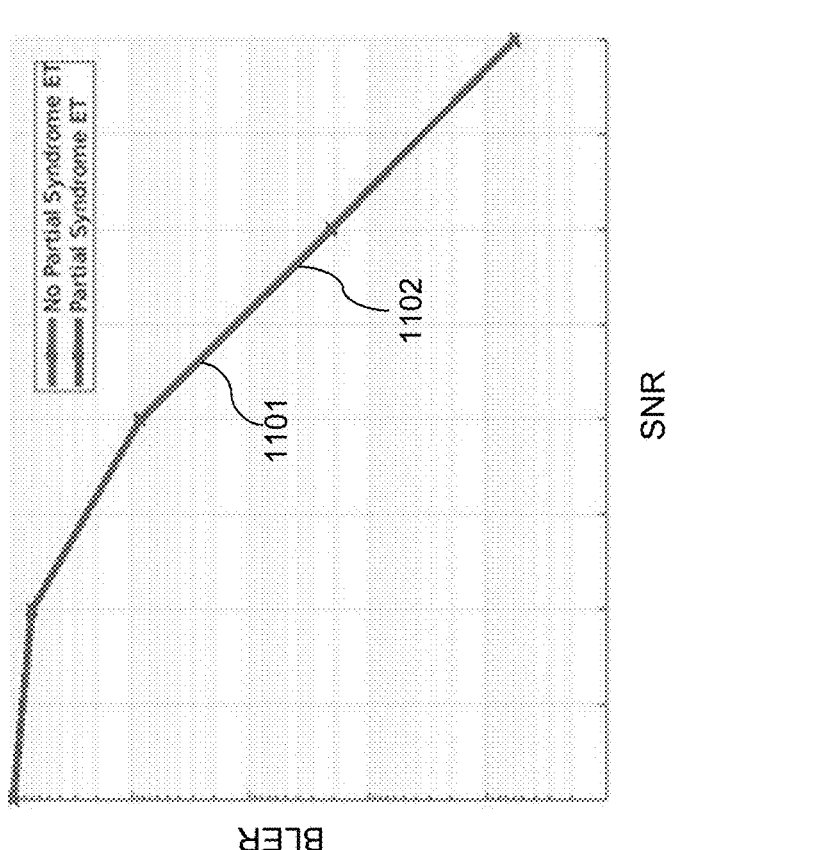

FIG. 11A and FIG. 11B are diagrams depicting simulation results of a partial syndrome early termination scheme, according to one or more embodiments. The simulations shown in FIG. 11A and FIG. 11B used the following configuration: (1) an LDPC code with a particular codeword size and a particular code rate is used; (2) a particular number of shortened bits and a particular number of punctured parity bits are used; (3) a maximum iteration is set to a particular value; and (4) binary phase-shift keying (BPSK) modulation is used over an additive white Gaussian noise (AWGN) channel. FIG. 11A shows block error rates (BLER) determined and/or output by (1) a decoder without partial symptom early termination (referred to as "non-PSET decoder") indicated by a line 1101 and (2) a decoder with a PSET scheme (referred to as "PSET decoder") indicated by a line 1102. As shown in FIG. 11A, both of the non-PSET decoder and the PSET decoder can determine the same BLER (the line 1101 and the line 1102 overlap). In other words, the PSET decoder can determine received bit errors (or received block errors) as well as the non-PSET decoder can do. FIG. 11B shows average number of iterations by (1) the non-PSET decoder indicated by 1151 and (2) the PSET decoder indicated by 1152. As shown in FIG. 11B, both of the non-PSET decoder and the PSET decoder can perform similarly at a low SNR (see the circled portion 1153), while the PSET decoder can perform better than the non-PSET decoder at a high SNR (see the circled portion 1154). It is noted that the line 1151 and the line 1152 overlap until SNR reaches a value Sie (1159), after which the overlapped line is split into separate lines 1151 and 1152.

Figure 12B:
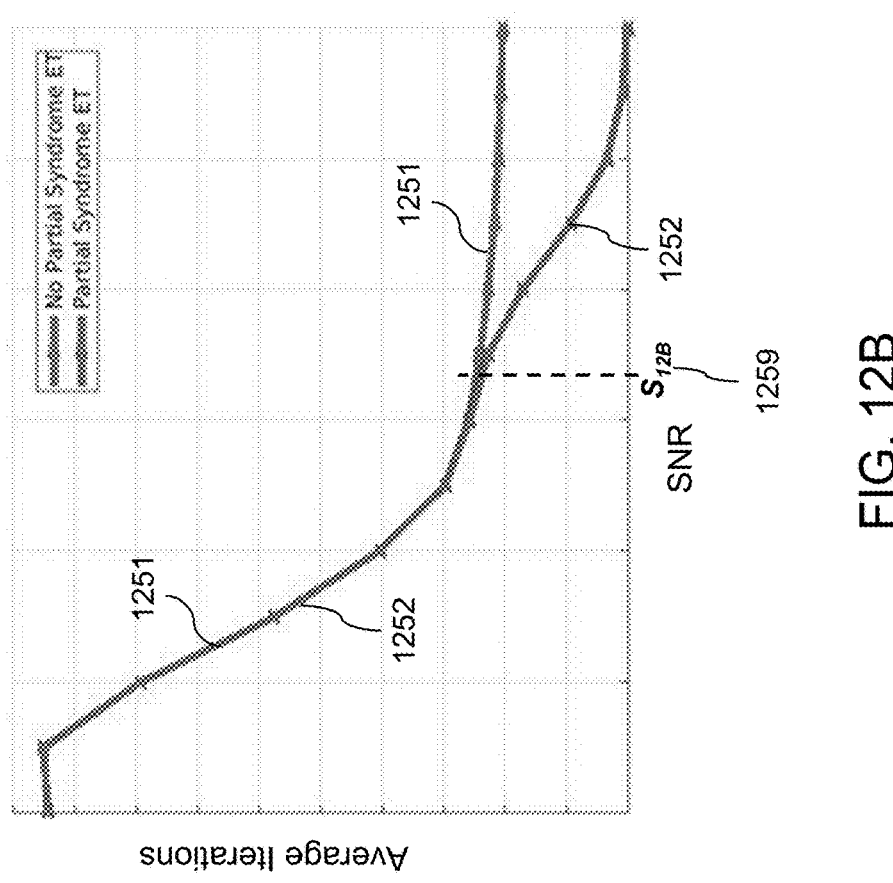
FIG. 12A and FIG. 12B are diagrams depicting simulation results of a partial syndrome early termination scheme, in which false positive early termination occurs.
Figure 12A:
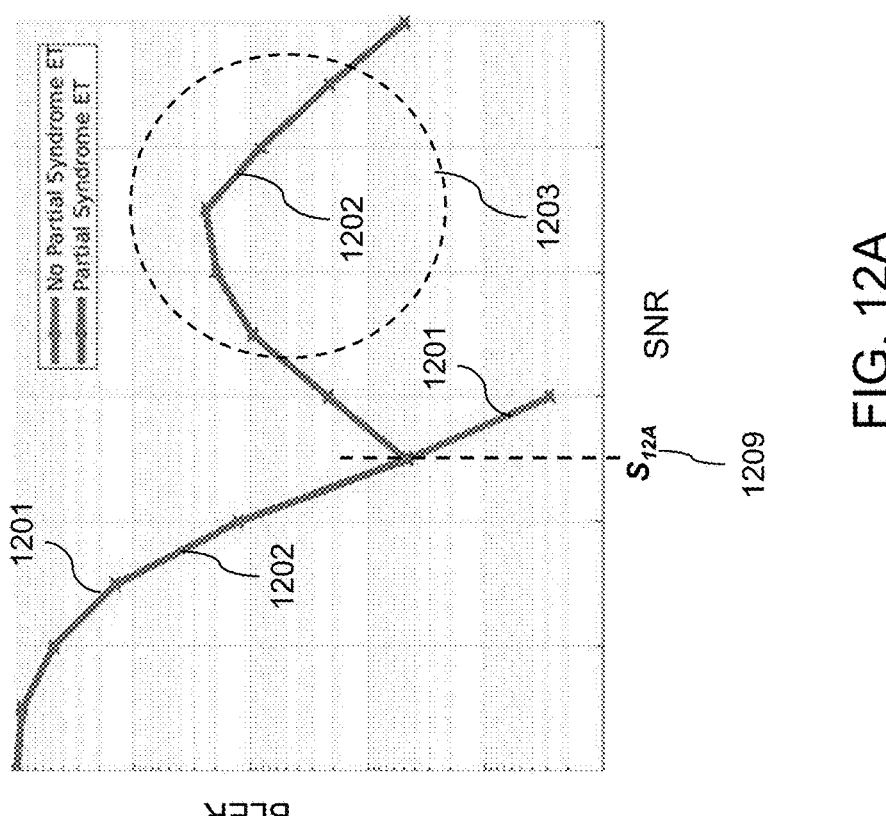

FIG. 12A and FIG. 12B are diagrams depicting simulation results of a partial syndrome early termination scheme, in which positive early termination occurs. The simulations shown in FIG. 12A and FIG. 12B used the following configuration: (1) an LDPC code with a particular codeword size and a particular code rate is used; (2) a particular number of shortened bits and a particular number of punctured parity bits are used; (3) a maximum iteration is set to a particular number; and (5) BPSK modulation is used over an AWGN channel. FIG. 12A shows block error rates (BLER) determined and/or output by (1) a non-PSET decoder indicated by a line 1201 and (2) a PSET decoder indicated by a line 1202. As shown in FIG. 12A, the PSET decoder can determine the BLER much higher than the non-PSET decoder at a high SNR (see the circled portion 1203). In other words, the PSET decoder may determine false positive early termination at the high SNR. It is noted that the line 1201 and the line 1202 overlap until SNR reaches a value $S_{12A}$ (1209), after which the overlapped line is split into separate lines 1201 and 1202. FIG. 12B shows average number of iterations by (1) the non-PSET decoder indicated by 1251 and (2) the PSET decoder indicated by 1252. As shown in FIG. 12B, the PSET decoder can perform significantly better than the non-PSET decoder at a high SNR due to false positive early termination. It is noted that the line 1251 and the line 1252 overlap until SNR reaches a value $S_{12B}$ (1259), after which the overlapped line is split into separate lines 1251 and 1252.

Figure 13B:
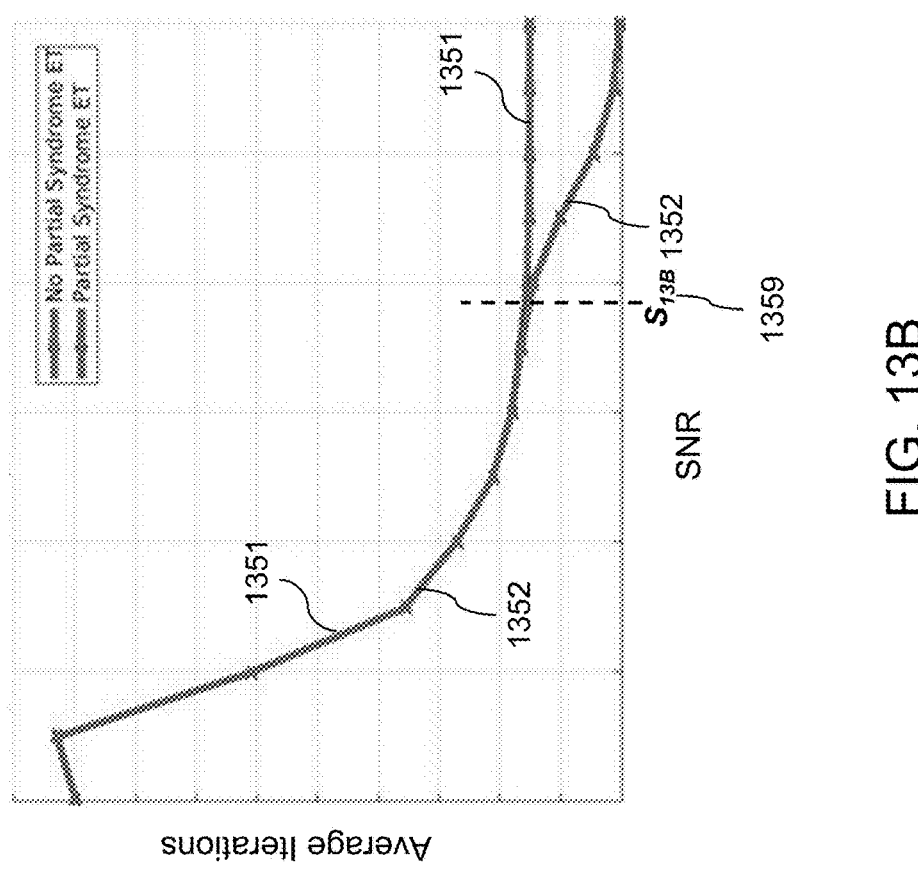
FIG. 13A and FIG. 13B are diagrams depicting simulation results of a partial syndrome early termination scheme, in which false positive early termination occurs.
Figure 13A:
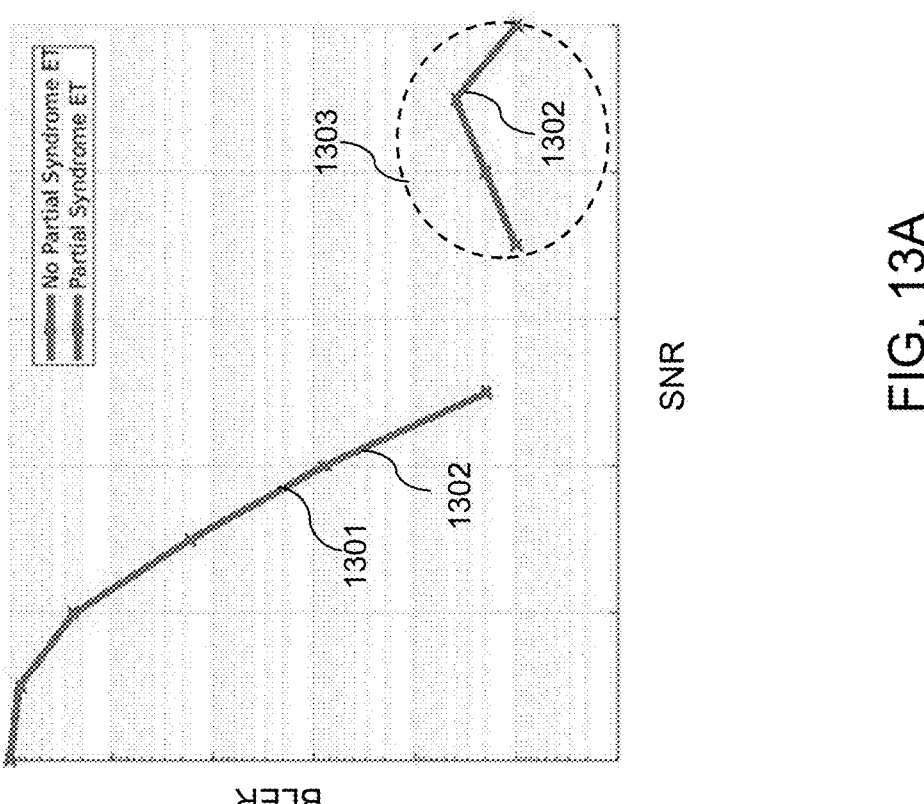

FIG. 13A and FIG. 13B are diagrams depicting simulation results of a partial syndrome early termination scheme, in which positive early termination occurs. The simulations shown in FIG. 13A and FIG. 13B used the following configuration: (1) an LDPC code with a particular codeword size and a particular code rate is used; (2) a particular number of shortened bits, a particular number of parity bits and a particular number of punctured parity bits are used; (3) a particular number of systematic bits is used; (4) a maximum iteration is set to a particular number; (7) MCS (modulation and coding system)-0 modulation (which uses BPSK) is used over an AWGN channel; and (8) data are transmitted/received using 26-RU (resource unit) 1×1 SISO (single-input single-output) system in a frequency bandwidth of 20 MHz. As shown in FIG. 13A, the PSET decoder determines that BLER occurs at a higher SNR while the non-PSET decoder determines no BLER at the high SNR (see the circled portion 1303). In other words, the PSET decoder may determine false positive early termination at the high SNR. It is noted that the line 1301 and the line 1302 overlap at lower SNRs. FIG. 13B shows average number of iterations by (1) the non-PSET decoder indicated by 1351 and (2) the PSET decoder indicated by 1352. As shown in FIG. 13B, the PSET decoder can perform significantly better than the non-PSET decoder at a high SNR due to false positive early termination. It is noted that the line 1351 and the line 1352 overlap until SNR reaches a value $S_{13B}$ (1359), after which the overlapped line is split into separate lines 1351 and 1352.

In one aspect, when the level of puncturing is very high (e.g., the number of punctured parity bits is greater than a threshold value), some of the systematic bits (e.g., information bits s in Equation 2) may not be protected by even a single parity check equation. For example, as shown in FIG. 12A to FIG. 13B, when the number of punctured parity bits is very high, the PSET decoder may determine false positive early termination, for example, bypassing LDPC decoding when there are in fact errors that need correcting. In contrast, when the number of punctured parity bits is not very high (see FIG. 11A and FIG. 11B), the PSET decoder may not determine false positive early termination.

To solve this problem (e.g., false positive early termination), systems and methods according to some embodiments of the present disclosure can ensure no false positives thereby ensuring no coding performance loss. In some implementations, a system (e.g., communication system, receiver circuitry, a decoder, a PSET decoder) can find a maximum level of puncturing (e.g., a maximum number of punctured parity bits, a minimum number of received parity bits) for each code (e.g., LDPC code) that can be tolerated by early termination using a partial syndrome.

In some implementations, to prevent excessive false positives, the system can selectively enable or perform PSET (partial syndrome early termination) using a threshold of the number of received parity bits (or equivalently the number of punctured parity bits). In some implementations, the system can disable, bypass, skip, avoid a partial syndrome technique/scheme when the puncturing is too high (e.g., when the number of receive bits is less than a threshold, or equivalently when the number of punctured parity bits is greater than a threshold). In some implementations, the system can determine a threshold in terms of the number of received parity bits or the number of punctured parity bits using simulations or experiments. For example, given an LDPC code with a particular codeword size and a particular code rate, a plurality of simulations of executing a PSET decoder can be performed at different degrees of SNRs by increasing the number of punctured parity bits. The system can find a minimum number of punctured parity bits (as a threshold) with which the PSET decoder can correctly determine that received data contain an error (or correctly determine non-zero BLER). In some implementations, the plurality of simulations of executing a non-PSET decoder with the same particular codeword size and the same particular code rate can be performed at different degrees of SNRs by increasing the number of punctured parity bits. The system can find a minimum number of puncture bits (as a threshold) with which both the PSET decoder and the non-PSET decoder make the same determination about an error of the received data. For example, with an LDPC code with a codeword size of 648 bits and a code rate ½, the system can set a threshold in terms of the number of punctured parity bits (referred to as "punctured parity bit threshold") to at most a certain number of punctured bits to apply a partial syndrome technique without introducing an error floor.

In some implementations, given an LDPC code with a particular codeword size and a particular code rate, a plurality of simulations of executing a PSET decoder can be performed at different degrees of SNRs by decreasing the number of received parity bits. The system can find a maximum number of received parity bits (as a threshold) with which the PSET decoder can correctly determine that received data contain an error (or correctly determine non-zero BLER). In some implementations, the plurality of simulations of executing a non-PSET decoder with the same particular codeword size and the same particular code rate can be performed at different degrees of SNRs by decreasing the number of received parity bits. The system can find a maximum number of received bits with which both the PSET decoder and the non-PSET decoder make the same determination about an error of the received data. For example, with an LDPC code with a codeword size of 648 bits and a code rate 1/2, the system can set a threshold in terms of the number of received parity bits (referred to as "received parity bit threshold") to at least a certain number of (received) parity bits to apply a partial syndrome technique without introducing an error floor.

In some implementations, thresholds for different LDPC codes can be defined as shown in Table 1 below.

| LDPC Code (codeword size n, code rate R) | Received Parity Bit Threshold ($Th_R$) | Punctured Parity Bit Threshold ($Th_P = n*(1 - R) - Th_R$) | Parity Puncture % Threshold | Comments |
|---|---|---|---|---|
| 648-b Rate-1/2 | 246 | 78 (=648 × 1/2 − 246) | 24% | |
| 648-b Rate-2/3 | 144 | 72 (=648 × 1/3 − 144) | 33% | Require at least 144 received parity bits for early termination |
| 648-b Rate-3/4 | 108 | 54 (=648 × 1/4 − 108) | 33% | Require at least 4 × 27 = 108 received parity bits for code early termination |
| 648-b Rate-5/6 | 84 | 24 (=648 × 1/6 − 84) | 22% | |
| 1296-b Rate-1/2 | 552 | 96 (=1296 × 1/2 − 552) | 15% | |
| 1296-b Rate-2/3 | 264 | 168 (=1296 × 1/3 − 264) | 39% | |
| 1296-b Rate-3/4 | 216 | 108 (=1296 × 1/4 − 216) | 33% | |
| 1296-b Rate-5/6 | 168 | 48 (=1296 × 1/6 − 168) | 22% | |

-continued

| LDPC Code (codeword size n, code rate R) | Received Parity Bit Threshold $(Th_R)$ | Punctured Parity Bit Threshold $(Th_p = n*(1 - R) - Th_R)$ | Parity Puncture % Threshold | Comments |
|---|---|---|---|---|
| 1944-b Rate-1/2 | 691 | 281  (=1944 × 1/2 − 691) | 29% | |
| 1944-b Rate-2/3 | 456 | 192  (=1944 × 1/3 − 456) | 30% | |
| 1944-b Rate-3/4 | 444 | 42  (=1944 × 1/4 − 444) | 9% | |
| 1944-b Rate-5/6 | 292 | 32  (=1944 × 1/6 − 292) | 10% | |

In some implementations, an apparatus may include a receiver and one or more processors. The receiver may be configured to receive LLR values corresponding to encoded data that is encoded using an LDPC code. The one or more processors may be configured to identify a number of punctured parity bits corresponding to the encoded data. The one or more processors may be configured to determine that the number of punctured parity bits is less than a threshold. The one or more processors may be configured to remove, from a first parity check matrix corresponding to the encoded data, one or more rows corresponding to the number of punctured parity bits to generate a second parity check matrix. The one or more processors may be configured to determine, using the LLR values and the second parity check matrix, that there is an error in the LLR values. The one or more processors may be configured to decode, by an LDPC decoder based at least on the determination, the LLR values to resolve the error.

In some implementations, the one or more processors may be configured to determine, using the encoded data and the second parity check matrix, that there is no error in the encoded data. The one or more processors may be configured to generate decoded bits corresponding to the LLR values.

In some implementations, in decoding the LLR values, the one or more processors may be configured to decode, by the LDPC decoder, the LLR values using the first parity check matrix. In some implementations, the one or more processors may be configured to determine that the number of punctured parity bits is greater than or equal to the threshold. The one or more processors may be configured to decode, by the LDPC decoder, the LLR values using the first parity check matrix.

In some implementations, in determining that there is an error in the LLR values, the one or more processors may be configured to multiply the second parity check matrix and a bit array representing the LLR values. The one or more processors may be configured to determine, using a result of the multiplication, that there is an error in the LLR values.

In some implementations, the receiver may be configured to receive a first set of LLR values that correspond to first encoded data and contain an error. The one or more processors may be configured to identify a first number of punctured parity bits corresponding to the first encoded data. The one or more processors may be configured to remove, from a third parity check matrix corresponding to the first encoded data, one or more rows corresponding to the first number of punctured parity bits to generate a fourth parity check matrix. The one or more processors may be configured to determine, using the first set of LLR values and the fourth parity check matrix, that there is an error in the first set of LLR values. The one or more processors may be configured to set the threshold to the first number of punctured parity bits.

In some implementations, the receiver may be configured to receive a plurality of sets of LLR values that correspond to a plurality of sets of encoded data, respectively, and contain an error. For each of the plurality of sets of LLR values, the one or more processors may be configured to identify a respective one of a plurality of numbers of punctured parity bits corresponding to a respective set of encoded data. The one or more processors may be configured to remove, from a parity check matrix corresponding to the respective set of encoded data, one or more rows corresponding to the respective number of punctured parity bits to generate another parity check matrix. The one or more processors may be configured to determine, using each set of LLR values and the another parity check matrix, that there is an error in each set of LLR values. The one or more processors may be configured to set the threshold to a minimum number among the plurality of numbers of punctured parity bits corresponding to the plurality of sets of encoded data.

In some implementations, an apparatus (e.g., communication system 108, computing system 2000) may include a receiver (e.g., receiver circuitry 140) and one or more processors (e.g., processors 2010). The receiver may be configured to receive LLR values corresponding to encoded data that is encoded using an LDPC code. The one or more processors may be configured to identify a number of punctured parity bits corresponding to the encoded data. The one or more processors may be configured to determine that the number of punctured parity bits is less than a threshold (e.g., punctured parity bit threshold). The one or more processors may be configured to determine, using the LLR values and a first parity check matrix corresponding to the encoded data (e.g., parity check matrix 1050), a first value (e.g., partial syndrome 1091) indicating whether there is an error in the LLR values, by removing contributions of the punctured parity bits to the first parity check matrix (e.g., by not including rows 3, 4 corresponding to the punctured parity bits in calculation of OR sum 1090). The one or more processors may be configured to determine, using the first value, that there is an error in the LLR values (e.g., when the partial syndrome is not zero or a zero vector).

In some implementations, the one or more processors may be configured to determine, using the first value, that there is no error in the encoded data (e.g., when the partial syndrome is zero or a zero vector). The one or more processors may be configured to generate decoded bits corresponding to the LLR values (e.g., the PSET system can perform partially syndrome early termination and generate decoded bits without correcting the LLR values).

In some implementations, in decoding the LLR values, the one or more processors may be configured to decode, by the LDPC decoder, the LLR values using the first parity check matrix (e.g., when the partial syndrome is not zero or a zero vector, the PSET system does not perform partial syndrome early termination and does correct the LLR values using the first parity check matrix corresponding to the received LLR values).

In some implementations, the one or more processors are configured to determine that the number of punctured parity bits is greater than or equal to the threshold, and decode, by the LDPC decoder, the LLR values using the first parity check matrix (e.g., when the puncturing is too high, the PSET system does not perform partial syndrome early termination and does correct the LLR values using the first parity check matrix corresponding to the received LLR values).

In some implementations, in determining that there is an error in the LLR values, the one or more processors may be configured to multiply the first parity check matrix (e.g., parity check matrix 1050) and a first bit array representing the LLR values (e.g., codeword 1060) to generate a second bit array representing a result of the multiplication (e.g., a (4×1) bit array representing a result of multiplying the parity check matrix 1050 and the codeword bit 1060; each element of the (4×1) bit array corresponds to a respective row). The one or more processors may be configured to select, from among the second bit array, one or more bits that do not correspond to the punctured parity bits. The one or more processors may be configured to calculate, as the first value, a sum of values of the selected one more bits (e.g., the sum of values of the selected one or more bits corresponds to a partial syndrome).

In some implementations, in determining that there is an error in the LLR values, the one or more processors may be configured to obtain a bit array representing the LLR values (e.g., codeword 1060). The one or more processors may be configured to select one or more rows of the first parity check matrix (e.g., rows 1, 2 of the parity check matrix 1050) that do not correspond to the punctured parity bits. The one or more processors may be configured to calculate, for each row of the selected one or more rows, an exclusive OR (XOR) of one or more bits of the bit array that correspond to non-zero elements of each row (e.g., the bits $C_1$ $C_5$ $C_6$ of the codeword bit array 1060 that correspond to non-zero element of row 1) to generate an XOR value of each row (e.g., $C_1 \oplus C_5 \oplus C_6$ in row 1). The one or more processors may be configured to calculate, as the first value (e.g., partial syndrome 1091), an OR of the XOR values of the selected one or more rows (e.g., OR sum 1090 of parities of rows 1 and 2).

Embodiments in the present disclosure have at least the following advantages and benefits. First, embodiments in the present disclosure can provide useful techniques for calculating a partial syndrome to avoid running an LDPC decoder at a high SNR to save 40-50% dynamic power. For example, when implemented with a 1×1 SISO system over a bandwidth of 20 MHZ, embodiments in the present disclosure can save up to 43% dynamic power.

Second, embodiments in the present disclosure can ensure no false positives thereby guarantying no coding performance loss. For example, embodiments in the present disclosure can find a maximum level of puncturing (e.g., a maximum number of punctured parity bits, a minimum number of received parity bits) for each code (e.g., LDPC code) that can be tolerated by early termination using a partial syndrome. In this manner, embodiments in the present disclosure still can cover a very large percentage of valid packet lengths for 802.11n/11ac/11ax/11be.

Third, embodiments in the present disclosure can implement the partial syndrome calculation circuits to be small relative to the size of the LDPC decoder so it can be readily implemented in products.

FIG. 14 is a flow diagram showing a process 1400 for decoding with a partial syndrome early termination scheme, in accordance with an embodiment. In some implementations, the process 1400 is performed by a receiver (e.g., receiver circuitry 140) and/or one or more processors (e.g. encoder 130 or processor 2010) of a device (e.g., communication system 105). In other embodiments, the process 1400 is performed by other entities (e.g., a computing system other than the communication system 105). In some implementations, the process 1400 includes more, fewer, or different steps than shown in FIG. 14.

At step 1402, the receiver (e.g., the receiver circuitry 140) may receive LLR values corresponding to encoded data (e.g., codeword with a size of 640) that is encoded using an LDPC code (e.g., LDPC code for a codeword size of 640 and a code rate of ½).

At step 1404, the one or more processors may identify a number of punctured parity bits corresponding to the encoded data (e.g., 64 punctured parity bits).

At step 1406, the one or more processors may determine that the number of punctured parity bits is less than a threshold (e.g., the number of punctured parity bits of 64 is less than the punctured parity bit threshold of 78 for a codeword size of 640 and a code rate of ½ (see Table 1)).

At step 1408, the one or more processors may remove, from a first parity check matrix corresponding to the encoded data (e.g., parity check matrix 850 corresponding to the codeword for 64 punctured parity bits), one or more rows corresponding to the number of punctured parity bits (e.g., rows corresponding to the 64 punctured parity bits) to generate a second parity check matrix (e.g. modified parity check matrix 970 after removing rows corresponding to the 64 punctured parity bits).

At step 1410, the one or more processors may determine, using the LLR values (e.g., codeword vector 800) and the second parity check matrix (e.g., modified parity check matrix 970), that there is an error in the LLR values. In some implementations, in determining that there is an error in the LLR values, the one or more processors may multiply the second parity check matrix (e.g., modified parity check matrix 970) and a bit array representing the LLR values (e.g., codeword vector 800). The one or more processors may determine, using a result of the multiplication, that there is an error in the LLR values (e.g., a partial syndrome 980 as a result of multiplying the codeword vector 800 and the modified parity check matrix 970 is not a zero vector).

At step 1412, the one or more processors may decode, by an LDPC decoder (e.g., LDPC decoder 740) based at least on the determination, the LLR values to resolve the error (e.g., LDPC decoder 740 can correct the error by iteration). In some implementations, in decoding the LLR values, the LDPC decoder may decode the LLR values using the first parity check matrix (e.g., original parity check matrix 850 used for encoding data corresponding to the LLR values).

In some implementations, the one or more processors may determine, using the encoded data and the second parity check matrix, that there is no error in the encoded data (e.g., the partial syndrome 980 as a result of multiplying the codeword vector 800 and the modified parity check matrix 970 is a zero vector), and generate decoded bits corresponding to the LLR values (e.g., decode data without error correction).

In some implementations, the one or more processors may determine that the number of punctured parity bits (e.g., 100) is greater than or equal to the threshold (e.g., the punctured parity bit threshold of 78 for a codeword size of 640 and a code rate of ½ (see Table 1)). The LDPC decoder may decode the LLR values using the first parity check matrix (e.g., LDPC decoder 740 can decode the LLR values using the original parity check matrix 850 without performing partial syndrome early termination).

In some implementations, the receiver may receive a first set of LLR values that correspond to first encoded data and contain an error (e.g., receive data that contain an error). The one or more processors may identify a first number of punctured parity bits corresponding to the first encoded data. The one or more processors may remove, from a third parity check matrix corresponding to the first encoded data, one or more rows corresponding to the first number of punctured parity bits to generate a fourth parity check matrix. The one or more processors may determine, using the first set of LLR values and the fourth parity check matrix, that there is an error in the first set of LLR values (e.g., a partial syndrome calculated based on the first number of punctured parity bits is not a zero vector indicating that there is an error). The one or more processors may set the threshold to the first number of punctured parity bits (e.g., the PSET system can set a threshold to a number of punctured parity bits that does not result in false positive early termination).

In some implementations, the receiver may receive a plurality of sets of LLR values that correspond to a plurality of sets of encoded data, respectively, and contain an error (e.g., receive data that contain an error). For each of the plurality of sets of LLR values, the one or more processors may identify a respective one of a plurality of numbers of punctured parity bits corresponding to a respective set of encoded data. The one or more processors may remove, from a parity check matrix corresponding to the respective set of encoded data, one or more rows corresponding to the respective number of punctured parity bits to generate another parity check matrix. The one or more processors may determine, using each set of LLR values and the another parity check matrix, that there is an error in each set of LLR values (e.g., a partial syndrome calculated based on the respective number of punctured parity bits is not a zero vector indicating that there is an error). The one or more processors may set the threshold to a minimum number among the plurality of numbers of punctured parity bits corresponding to the plurality of sets (e.g., the PSET system can set a threshold to a minimum number among a plurality of numbers of punctured parity bits that do not result in false positive early termination).

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities (e.g., STAs, APs, beamformers and/or beamformees) that can operate within a system or environment. It should be understood that the systems described above can provide multiple ones of any or each of those components and these components can be provided on either a standalone machine or, In some implementations, on multiple machines in a distributed system. Further still, bit field positions can be changed and multibit words can be used. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

I claim:

1. An apparatus comprising:
   a receiver configured to receive a signal comprising low-density parity-check (LDPC) encoded data and generate log likelihood ratio (LLR) values corresponding to the LDPC encoded data; and
   one or more processors configured to:
   identify a number of punctured parity bits corresponding to the LDPC encoded data;
   determine that the number of punctured parity bits is less than a threshold;
   remove, from a first parity check matrix corresponding to the LDPC encoded data, one or more rows corresponding to the number of punctured parity bits to generate a second parity check matrix;
   determine, using the LLR values and the second parity check matrix, that there is an error in the LLR values; and
   decode, by an LDPC decoder based at least on the determination, the LLR values to resolve the error.

2. The apparatus of claim 1, wherein the one or more processors are configured to:
   determine, using the LDPC encoded data and the second parity check matrix, that there is no error in the LDPC encoded data, and
   generate decoded bits corresponding to the LLR values.

3. The apparatus of claim 1, wherein in decoding the LLR values, the one or more processors are configured to:
   decode, by the LDPC decoder, the LLR values using the first parity check matrix.

4. The apparatus of claim 1, wherein the one or more processors are configured to:
   determine that the number of punctured parity bits is greater than or equal to the threshold, and
   decode, by the LDPC decoder, the LLR values using the first parity check matrix.

5. The apparatus of claim 1, in determining that there is an error in the LLR values, the one or more processors are configured to:
   multiply the second parity check matrix and a bit array representing the LLR values; and
   determine, using a result of the multiplication, that there is an error in the LLR values.

6. The apparatus of claim 1, wherein the receiver is configured to receive a first set of LLR values that correspond to first encoded data and contain an error;

the one or more processors are configured to:

identify a first number of punctured parity bits corresponding to the first encoded data;

remove, from a third parity check matrix corresponding to the first encoded data, one or more rows corresponding to the first number of punctured parity bits to generate a fourth parity check matrix;

determine, using the first set of LLR values and the fourth parity check matrix, that there is an error in the first set of LLR values; and set the threshold to the first number of punctured parity bits.

7. The apparatus of claim 1, wherein the receiver is configured to receive a plurality of sets of LLR values that correspond to a plurality of sets of encoded data, respectively, and contain an error;

for each of the plurality of sets of LLR values, the one or more processors are configured to:

identify a respective one of a plurality of numbers of punctured parity bits corresponding to a respective set of encoded data, remove, from a parity check matrix corresponding to the respective set of encoded data, one or more rows corresponding to the respective number of punctured parity bits to generate another parity check matrix, and determine, using each set of LLR values and the another parity check matrix, that there is an error in each set of LLR values; and set the threshold to a minimum number among the plurality of numbers of punctured parity bits corresponding to the plurality of sets of encoded data.

8. An apparatus comprising:

a receiver configured to receive a signal comprising low-density parity-check (LDPC) encoded data and generate log likelihood ratio (LLR) values corresponding to the LDPC encoded data; and one or more processors configured to:

identify a number of punctured parity bits corresponding to the LDPC encoded data;

determine that the number of punctured parity bits is less than a threshold;

determine, using the LLR values and a first parity check matrix corresponding to the LDPC encoded data, a first value indicating whether there is an error in the LLR values, by removing contributions of the punctured parity bits to the first parity check matrix; and determine, using the first value, that there is an error in the LLR values.

9. The apparatus of claim 8, wherein the one or more processors are configured to:

determine, using the first value, that there is no error in the LDPC encoded data, and generate decoded bits corresponding to the LLR values.

10. The apparatus of claim 8, wherein in decoding the LLR values, the one or more processors are configured to:

decode, by the LDPC decoder, the LLR values using the first parity check matrix.

11. The apparatus of claim 8, wherein the one or more processors are configured to:

determine that the number of punctured parity bits is greater than or equal to the threshold, and decode, by the LDPC decoder, the LLR values using the first parity check matrix.

12. The apparatus of claim 8, in determining that there is an error in the LLR values, the one or more processors are configured to:

multiply the first parity check matrix and a first bit array representing the LLR values to generate a second bit array representing a result of the multiplication;

select, from among the second bit array, one or more bits that do not correspond to the punctured parity bits; and calculate, as the first value, a sum of values of the selected one more bits.

13. The apparatus of claim 8, in determining that there is an error in the LLR values, the one or more processors are configured to:

obtain a bit array representing the LLR values;

select one or more rows of the first parity check matrix that do not correspond to the punctured parity bits;

calculate, for each row of the selected one or more rows, an exclusive OR (XOR) of one or more bits of the bit array that correspond to non-zero elements of each row, to generate an XOR value of each row; and calculate, as the first value, an OR of the XOR values of the selected one or more rows.

14. A method comprising:

receiving, by a receiver, a signal comprising low-density parity-check (LDPC) encoded data and generating log likelihood ratio (LLR) values corresponding to the LDPC encoded data; and identifying, by one or more processors, a number of punctured parity bits corresponding to the LDPC encoded data;

determine, by the one or more processors, that the number of punctured parity bits is less than a threshold;

removing, by the one or more processors from a first parity check matrix corresponding to the LDPC encoded data, one or more rows corresponding to the number of punctured parity bits to generate a second parity check matrix;

determining, by the one or more processors using the LLR values and the second parity check matrix, that there is an error in the LLR values; and decoding, by an LDPC decoder based at least on the determination, the LLR values to resolve the error.

15. The method of claim 14, further comprising:

determining, using the LDPC encoded data and the second parity check matrix, that there is no error in the LDPC encoded data, and generating decoded bits corresponding to the LLR values.

16. The method of claim 14, decoding the LLR values comprises decoding, by the LDPC decoder, the LLR values using the first parity check matrix.

17. The method of claim 14, further comprising:

determining that the number of punctured parity bits is greater than or equal to the threshold, and decoding, by the LDPC decoder, the LLR values using the first parity check matrix.

18. The method of claim 14, wherein determining that there is an error in the LLR values comprises:

multiplying the second parity check matrix and a bit array representing the LLR values; and determining, using a result of the multiplication, that there is an error in the LLR values.

19. The method of claim 14, further comprising:

receiving, by the receiver, a first set of LLR values that correspond to first encoded data and contain an error;

identifying, by the one or more processors, a first number of punctured parity bits corresponding to the first encoded data;

removing, by the one or more processors, from a third parity check matrix corresponding to the first encoded data, one or more rows corresponding to the first number of punctured parity bits to generate a fourth parity check matrix;

determining, by the one or more processors using the first set of LLR values and the fourth parity check matrix, that there is an error in the first set of LLR values; and setting, by the one or more processors, the threshold to the first number of punctured parity bits.

20. The method of claim 14, further comprising:

receiving, by the receiver, a plurality of sets of LLR values that correspond to a plurality of sets of encoded data, respectively, and contain an error;

for each of the plurality of sets of LLR values:

identifying a respective one of a plurality of numbers of punctured parity bits corresponding to a respective set of encoded data, removing, from a parity check matrix corresponding to the respective set of encoded data, one or more rows corresponding to the respective number of punctured parity bits to generate another parity check matrix, and determining, using each set of LLR values and the another parity check matrix, that there is an error in each set of LLR values; and setting the threshold to a minimum number among the plurality of numbers of punctured parity bits corresponding to the plurality of sets of encoded data.

* * * * *